United States Patent
Washio et al.

(10) Patent No.: US 7,420,402 B2
(45) Date of Patent: Sep. 2, 2008

(54) FLIP-FLOPS, SHIFT REGISTERS, AND ACTIVE-MATRIX DISPLAY DEVICES

(75) Inventors: Hajime Washio, Sakurai (JP); Yuhichiroh Murakami, Matsusaka (JP); Michael James Brownlow, Drayton Village (GB)

(73) Assignee: Sharp Kabushiki Kaisha, Osaka (JP)

( * ) Notice: Subject to any disclaimer, the term of this patent is extended or adjusted under 35 U.S.C. 154(b) by 93 days.

(21) Appl. No.: 11/043,178

(22) Filed: Jan. 27, 2005

(65) Prior Publication Data

US 2005/0184784 A1    Aug. 25, 2005

(30) Foreign Application Priority Data

Jan. 28, 2004    (JP)    ............................ 2004-020342
Jan. 25, 2005    (JP)    ............................ 2005-017432

(51) Int. Cl.
     H03K 3/356    (2006.01)

(52) U.S. Cl. .................................. 327/208; 327/202

(58) Field of Classification Search ......... 327/199–200, 327/202–203, 208–212, 214–215, 217–218, 327/219

See application file for complete search history.

(56) References Cited

U.S. PATENT DOCUMENTS

| | | | |
|---|---|---|---|
| 4,804,864 A | 2/1989 | Spence | |
| 5,075,570 A | 12/1991 | Shewchuk et al. | |
| 5,557,225 A * | 9/1996 | Denham et al. | ............. 327/199 |
| 5,949,265 A | 9/1999 | Bracchitta et al. | |
| 6,046,617 A | 4/2000 | Hoeld | |
| 6,147,534 A * | 11/2000 | Kim et al. | ................... 327/200 |
| 6,222,791 B1 * | 4/2001 | Becker et al. | ............... 365/233 |
| 6,333,656 B1 * | 12/2001 | Schober | ...................... 327/202 |
| 6,377,104 B2 | 4/2002 | Cairns et al. | ................ 327/291 |
| 6,703,881 B2 * | 3/2004 | Lu | .............................. 327/203 |
| 2001/0043496 A1 | 11/2001 | Cairns et al. | |
| 2003/0174115 A1 | 9/2003 | Washio et al. | |

FOREIGN PATENT DOCUMENTS

| | | |
|---|---|---|
| EP | 0508673 A2 | 10/1992 |
| JP | 64-024504 | 1/1989 |
| JP | 01-101724 | 4/1989 |
| JP | 01-191512 | 8/1989 |
| JP | 08-297475 | 11/1996 |
| JP | 2000-020029 | 1/2000 |
| KR | 2000-0002858 | 1/2000 |
| KR | 2000-0077467 | 12/2000 |

OTHER PUBLICATIONS

European Search Report dated Jul. 27, 2006.

* cited by examiner

*Primary Examiner*—Quan Tra
(74) *Attorney, Agent, or Firm*—Harness, Dickey & Pierce, P.L.C.

(57) ABSTRACT

A latch section includes a latch circuit. The latch circuit includes inverters and latches an input signal from a gating section. Between one of the inverters of the latch circuit and the output terminal OUT is disposed an analog switch whose ON/OFF characteristics are switched according to High/Low of a reset signal. Between the output terminal and an input for receiving a low potential as a power supply of a flip-flop is disposed a switching element whose ON/OFF characteristics are switched according to High/Low of the reset signal.

36 Claims, 22 Drawing Sheets

INVERTER I/O

INVERTER CIRCUT OUTPUT

FLIP-FLOPS, SHIFT REGISTERS, AND ACTIVE-MATRIX DISPLAY DEVICES

This Nonprovisional application claims priority under 35 U.S.C. § 119(a) on Patent Application No. 020342/2004 filed in Japan on Jan. 28, 2004, and Patent Application No. 017432/2005 filed in Japan on Jan. 25, 2005, the entire contents of which are hereby incorporated by reference.

FIELD OF THE INVENTION

The present invention generally relates to flip-flops, a shift register including multiple stages of flip-flops, and/or an active-matrix display device using the shift register for a scan signal line driving circuit or data signal line driving circuit.

BACKGROUND OF THE INVENTION

Active-matrix display devices require a scan signal line driving circuit and data signal line driving circuit for driving an array of pixels disposed in a matrix. The scan signal line driving circuit and data signal line driving circuit use shift registers to drive the gate lines and source lines in predetermined sequence. The shift register is realized by multiple stages of flip-flops connected to one another.

The following will describe a structure of conventional flip-flops making up a shift register. The flop-flop described below is a set-reset flip-flop (hereinafter "RS flip-flop") having a control terminal GB, an input terminal CK, a reset terminal RB, and an output terminal OUT, as illustrated in FIG. 17.

FIG. 18 shows an exemplary structure of the RS flip-flop. The RS flip-flop shown in FIG. 18 includes an inverter circuit 101 in which a p-type transistor Mp1 and an n-type transistor Mn1 (hereinafter, p-type transistors and n-type transistors will be denoted by Mp and Mn, respectively) are connected in series between power supply VDD (high potential) and VSS (low potential). A control terminal GB is connected to the input side of the inverter circuit 101, i.e., to the gates of the Mp1 and Mn1.

Between the power supply VDD and the input terminal CK are serially connected a CMOS analog switch ASW and Mp3, wherein the CMOS analog switch ASW includes Mn2 and Mp2 connected parallel to each other. In the analog switch ASW, the gate of Mn2 is connected to the output of the inverter circuit 101 (junction between the source of Mp1 and the drain of Mn1), and the gate of Mp2 is connected to the control terminal GB. The gate of Mp3 is connected to a reset terminal RB.

Supplying VDD to the gate of Mn2 in the analog switch ASW connects the source and drain of Mn2, while the source and drain of Mn2 is cut off when VSS is supplied. On the other hand, supplying VSS to the gate of Mp2 connects the source and drain of Mp2, while the source and drain of Mp2 is cut off when the gate of Mp2 is connected to VDD. By these operations of Mn2 and Mp2, the analog switch ASW controls the supply of input signal CK.

Between power supply VDD and VSS, the RS flip-flop includes an inverter circuit 102 including Mp4 and Mn4, and an inverter circuit 103 including Mp5 and Mn5. The inverter circuit 102 and the inverter circuit 103 together form a latch circuit by connecting their inputs and outputs to each other (an input of the inverter circuit 102 is connected to an output of the inverter circuit 103, and an output of the inverter circuit 102 is connected to an input of the inverter circuit 103). Between the Mn4 of the inverter circuit 102 and the power supply VSS is an Mn6, whose gate is connected to the reset terminal RB.

The junction between Mp3 and the analog switch ASW is connected to an output of the inverter circuit 102 (the junction between the source of Mp4 and the drain of Mn4). (The junction of Mp3 and the analog switch ASW, and the output of the inverter circuit 102 have a Node A potential.) An output of the inverter circuit 103 (the junction between the source of Mp5 and the drain of Mn5) is connected to the output terminal OUT.

In the RS flip-flop, the inverter circuit 101, Mp3, and analog switch ASW realize a gating section. The inverter circuit 102, inverter circuit 103, and Mn6 realize a latch section. The gating section is a functional block for sending an externally supplied input signal to the latch section of the following stage according to a control signal separately supplied from the input signal. The latch section is a functional block for latching the input signal supplied from the gating section.

Referring to FIG. 19, the following will describe operations of the RS flip-flop shown in FIG. 18.

A timing chart of FIG. 19 assumes that the control signal GB, clock signal CK, and reset signal RB are respectively input to the control terminal GB, input terminal CK, and reset terminal RB of the RS flip-flop.

First, when the control signal GB falls to low (VSS) at time t1, the output of the inverter circuit 101 becomes VDD, and the VDD is supplied to the gate of Mn2 in the analog switch ASW. Here, the gate of Mp2 in the analog switch ASW receives VSS (control signal GB).

As a result, the analog switch ASW closes, supplying the input signal CK to the Node A. Here, the reset signal RB is high (VDD) and the Mp3 is open. Accordingly, the Node A has the potential of the input signal CK.

The high level (VDD) reset signal RB is also supplied to the gate of Mn6. With the Mn6 turned on, the MN4 and Mp4 can operate as the inverter circuit 102. The potential of the Node A is the input of the inverter circuit 103. Accordingly, in this state, the output of the inverter circuit 103—the output signal OUT of the RS flip-flop—is low (VSS). When the potential at the junction between the input of the inverter circuit 102 and the output of the output circuit 103 is regarded as a Node B potential, the Node B potential is also at low level. Here, the potential of the output signal OUT is latched by the inverter circuit 102 and the inverter circuit 103.

When the clock signal CK becomes low (VSS) at time t2, the potential of the Node A becomes (VSS) low. The Node B potential and the output signal OUT become high (VDD).

When the control signal GB becomes high (VDD) at time t3, the analog switch ASW1 opens, stopping supply of the clock signal CK to the Node A. Here, since the reset signal RB remains high (VDD), the Mn6 is ON and the inverter circuits 102 and 103 operate as a latch circuit. Accordingly, the Node A potential remains low (VSS), and the Node B potential and the output signal (OUT) remain high (VDD).

When the reset signal RB becomes low (VSS) at time t4, the Mp3 is turned on and the Mn6 is turned off. Accordingly, the Mn4 and Mp4 do not operate as the inverter circuit 102, canceling the latch state. With the Mp3 turned on, the Node A potential becomes high (VDD), which is supplied to the respective gates of the Mn5 and Mp5 making up the inverter circuit 103. As a result, the Node B potential and the output signal OUT become low (VSS).

After time t5, the control signal GB is high (VDD), and the signal CK is not applied to the Node A. Further, since the reset signal RB is high, the Mp3 is turned off, and the Mn6 is turned on. This operates the inverter circuit 102 and causes it to latch the Node B potential and the output signal OUT with the latch circuit 103. The Node B potential and the output signal OUT are maintained at low level (VSS).

Referring to FIG. 20, the following will describe another exemplary structure of the RS flip-flop.

An RS flip-flop shown in FIG. 20 is structured such that it receives a control signal GB, a clock signal CK, an inverted clock signal CKB, and a reset signal RB, wherein the clock signal CK and inverted clock signal CKB have amplitudes smaller than that produced by VDD, which is a power supply of the flip-flop.

As with the RS flip-flop of FIG. 18, the RS flip-flop shown in FIG. 20 includes a gating section and a latch section. The latch section is the same as that in the RS flip-flop of FIG. 18. Only the gating section is different.

In the gating section of the RS flip-flop shown in FIG. 20, Mp11 and Mn11 are connected in series between the power supply VDD and the input terminal CKB, and Mp12 and Mn12 are connected in series between the power supply VDD and the input terminal CK. An Mn13 is disposed between a power supply VSS and the junction of the Mp11 source and Mn11 drain.

The respective gates of the Mp11 and Mn13 are connected to the control terminal GB. The respective gates of the Mn11 and Mn12 are connected to the junction between the Mp11 source and Mn11 drain. The gate of the Mp12 is connected to the reset terminal RB. The junction between the Mp12 source and Mn12 drain is connected to Node A. The junction between the Mp11 source and Mn11 drain is Node C.

In the RS flip-flop structured as shown in FIG. 20, it is assumed, for example, that the clock signal and inverted clock signal CKB each have an amplitude of 3.3 V, and that the VDD and VSS of the circuit are 8 V and 0 V, respectively. For example, when the GB terminal is low and the threshold of the n-type transistors in the circuit is 3.5 V, supplying a low level signal CKB (VSS=0 V) and a 3.3 V signal CK turns on Mp11 and causes Mn11 to operate in a diode-like manner. As such, the Node C maintains a potential near 3.5 V, close to the threshold of Mn11.

Here, the clock signal CK is supplied to the source of Mn12, and the gate of the Mn12 is connected to Node C. Accordingly, the gate-source potential of the Mn12 is about 0.2 V. Here, the Mn12 is turned off when it has a threshold of about 3.5 V as does the Mn11.

On the other hand, when the inverted clock signal CKB and clock signal CK are 3.3 V and 0 V, respectively, the Node C has a potential of about 6.8 V by adding the 3.5 V threshold of Mn11 to 3.3 V. Here, since the clock signal CK is 0 V, the source-gate voltage of Mn12 is about 6.8 V even when the threshold of Mn12 is 3.5 V. Accordingly, the Mn12 is turned on, and the Node A is 0 V.

Referring to FIG. 21, the following will describe operations of the RS flip-flop shown in FIG. 20.

A timing chart shown in FIG. 21 assumes that the control signal GB, clock signal CK, inverted clock signal CKB, and reset signal RB are respectively input to the control terminal GB, input terminal CK, input terminal CKB, and reset terminal RB of the RS flip-flop.

When the control signal GB becomes low (VSS) at time t1, the Mp11 is turned on and Mn13 is turned off. Here, since the inverted clock signal CKB, the clock signal CK, and the threshold voltage of Mn11 are 0V, 3.3 V, and 3.5 V, respectively, the gate potential of Mn12 (Node C potential) is about 3.5 V, and the source potential of Mn12 is 3.3 V. As such, the Mn12 is turned off. Here, since the reset signal RB is high (VDD=8 V), the Mp12 is off and Mn6 is on, causing the Mp4 and Mn4 to operate as the inverter circuit 102. The inverter circuit 102 forms a latch circuit with the inverter circuit 103 including Mp5 and Mn5, and accordingly the Node A remains at low level.

At time t2, when the inverted clock signal CKB and clock signal CK become 3.3 V and 0 V, respectively, the node C becomes about 6.8 V by adding 3.3 V to the 3.5 V threshold of the Mn11. The potential of the node C is applied to the gate of Mn12. Here, since the source of Mn12 is 0 V, the Mn12 is turned on and the Node A becomes low. Here, the reset signal RB is still at high level (VDD=8 V), the Mp12 is off and Mn6 is on, causing the Mp4 and Mn4 to operate as the inverter circuit 102. When the Node A becomes low, the latch circuit realized by the inverter circuits 102 and 103 changes its state, and the output signal OUT becomes high (VDD=8 V).

At time t3, the control signal GB becomes high (VDD=8 V), turning off the Mp11, and turning on the Mn13. As a result, the respective gates of the Mn11 and Mn12 become low level (VSS=0 V), cutting off the clock signal CK and inverted clock signal CKB. Thus, when the control signal GB is at high level (VDD=8 V), the flip-flop will not be affected by the clock signal CK or inverted clock signal CKB regardless of the states of these clock signals. Here, since the Mn12 is off, no clock signal CK is supplied to the Node A. The Node A is maintained at low level by the latch circuit realized by the inverter circuits 102 and 103, and the output OUT remains at high level (VDD=8 V).

After time t4, the reset signal RB becomes low (VSS=0 V), and the Mp12 is turned on. At the same time, the reset signal RB is also supplied to the gate of Mn6, turning on the Mn6. Accordingly, the Mn4 and Mp4 do not operate as the inverter circuit 102. As a result, the Node A becomes high (VDD=8 V), and the output signal OUT becomes low as it passes through the inverter circuit 103.

At time t5, the reset signal RB becomes high, turning off the Mp12, and turning on the Mn6. This causes the circuit including Mn4 and Mp4 to operate as the inverter circuit 102 again, causing the inverter circuit 102 to operate as a latch circuit again with the inverter circuit 103. As a result, the Node A is maintained at high level, and accordingly the output signal OUT is maintained at low level.

FIG. 22 illustrates an exemplary structure of a shift register using RS flip-flops structured as above. The shift register shown in FIG. 22 uses the RS flip-flop shown in FIG. 18.

The shift register includes a plurality of serially connected RS flip-flops FF1, FF2, . . . , wherein an input terminal CK of an RS flip-flop FFa (a=2n−1, n=1, 2, . . . ) receives a clock signal CK, and an input terminal CK of an RS flip-flop FFa (a=2n, n=1, 2, . . . ) receives an inverted clock signal CKB.

A GB terminal of a first-stage RS flip-flop FF1 receives a start pulse signal SPB, and an output OUT from each stage of RS flip-flops FFa becomes the output (Q1, Q2, Q3, . . . ) of the shift register. Further, an output Q1 from each stage of the RS flip-flops FF1, FF2, . . . is supplied (GB2, GB3, . . . ) through an inverter to a GB terminal of the next-stage RS flip-flop FF.

In the RS flip-flops FF2, FF3, . . . of the second and subsequent stages, an inverted signal of the output (Q2, Q3, . . . ) is supplied to a GB terminal of the next stage, and also to an RB terminal of the RS flip-flop of the preceding stage, where the output is used as a reset signal. For example, a signal GB3, which is an inverted signal of the output Q2 of the second-stage RS flip-flop FF2, is supplied to the GB terminal of the third-stage RS flip-flop FF3, and to the RB terminal of the first-stage RS flip-flop FF1.

Referring to a timing chart of FIG. 23, the following will describe operations of the shift register.

At time t1, a start pulse signal SPB is supplied to the GB terminal of FF1. When the clock signal becomes low at time t2, the OUT signal of the FF1, i.e., signal Q1, becomes high.

The signal Q1 is supplied as a signal GB2 to the GB terminal of FF2 via the inverter. That is, the GB terminal of the FF2 receives a low level signal.

With the signal GB2 of a low level supplied to the GB terminal of FF2, changing the inverted clock signal CKB to low at time t3 causes the OUT signal of FF2, i.e., signal Q2, to be a high level. The signal GB3, which is the inverted signal of the signal Q2, becomes low. The signal GB3 is supplied to the GB terminal of FF3. The signal GB3 is also supplied to the RB terminal of FF1, resetting FF1 and switching Q1 to low.

In this manner, the serially connected set-reset flip-flops serve as a shift register in synchronism with signal CK and signal CKB. The shift register is operative even when the signal CK and signal CKB have smaller amplitudes than the power voltage VDD of the circuit.

Meanwhile, Japanese Laid-Open Patent Publication No. 356728/2001 (published on Dec. 26, 2001; corresponding U.S. Pat. No. 6,377,104B2) discloses a static clock pulse generator including multiple stages of D-type flip-flops and gating sections.

The shift register disclosed in this publication is usable in a scan signal line driving circuit or data signal line driving circuit of an active-matrix device. In the scan signal line driving circuit, the shift register is used to successively generate scan signals for the respective scan lines at predetermined timings. In the data signal line driving circuit, the shift register is used to generate a sampling signal for sending data signals to the respective source lines at predetermined timings. The data signals are supplied through data supply lines.

The timing charts of FIGS. 19, 21, and 23 do not take into account signal delays. As such, in the flip-flop of each stage, the rise of the output signal OUT (or output Q) and the fall of the control signal CK occur substantially at the same time, and the fall of the output signal OUT (or output Q) and the fall of the reset signal RB occur substantially at the same time. However, in actual flip-flops, there is a delay when the output signal OUT rises or falls in response to the fall of the control signal CK or reset signal RB.

For example, when a conventional shift register is used in the data signal line driving circuit, a signal delay in the output of the shift register causes the following problems. In the data signal line driving circuit, a sampling signal generated by the shift register needs to be timed with the data signal fed through the data feed lines. However, when a delay in the sampling signal shifts the generated timings of the sampling signal and the data signal fed through the data feed lines, desired data may not be properly sent to the source lines.

The problem of signal delay can also be caused when a conventional shift register is used in the scan signal line driving circuit, because the scan signal generated by the shift register needs to be timed with the data signals supplied to the source lines.

The foregoing problems can be solved by adjusting the respective timings of various input signals in expectation of a signal delay in the shift register. However, a problem of such a method is that it requires a means to adjust timings and thereby increases circuit size. Further, in order to provide enough margin for adjusting timings of input signals, the frequency of the master clock needs to be increased. This increases power consumption of the circuit.

A signal delay can be reduced by improving rising and falling characteristics of the shift register. However, this is associated with the following problems.

As an example, the following considers output signal Q2. In order to reduce a time delay in the fall of the output signal Q2, a reset signal (signal GB4) needs to be supplied to the reset terminal of FF2 without a delay. In addition, the falling characteristics of FF2 itself needs to be improved.

For example, in the operation of the FF3 (may have a structure shown in FIG. 18 or FIG. 20) that outputs an output signal Q3 used to generate signal GB4, the output speed of the output signal Q3 (rising characteristics of the output signal Q3) can be improved by improving the capability of Mn4. This can be achieved by designing Mp4 such that its W size (channel width) is smaller than that of Mn4. This enables a current to flow through Mn4 more easily and thereby reduces the rise time of the output Q.

Meanwhile, the output signal Q2 of FF2 is inverted to a signal GB3 and becomes the reset signal for the FF1 of the preceding stage. Again, in order to reduce a time delay in the fall of the output signal Q1, it is required to improve the rising characteristics of the output signal Q2 in FF2 for the reasons described above. (This is achieved by designing Mp4 such that its W size (channel width) is smaller than that of Mn4, thus improving the current flowing capability of Mn4.) However, in terms of reducing a time delay also in the fall of the output signal Q2, improving rising characteristics of the output signal Q2 defeats the idea of improving falling characteristics of the FF2 itself.

That is, a shift register using conventional flip-flops has a self-contained problem in that the falling characteristics of the output stage producing a signal that falls in response to a reset signal supplied from the next stage are sacrificed by the improved rising characteristics of its output signal OUT produced to improve resetting capability of the preceding stage.

SUMMARY OF THE INVENTION

An object of an embodiment of the present invention is to provide a flip-flop whose rising and falling characteristics can be improved at the same time. With the flip-flop, an embodiment of the invention reduces a signal delay in a shift register including a plurality of such flip-flops connected to one another, and in an active-matrix display device using the shift register in its scan signal line driving circuit or data signal line driving circuit.

In order to achieve an object, a flip-flop of an embodiment of the present invention includes: a gating section for sending an externally supplied input signal to a latch section of a following stage according to a control signal separately supplied from the input signal; and a latch section including a latch circuit for latching the input signal supplied from the gating section, wherein the latch section further includes a latch canceling section for canceling a latch state of the latch circuit with an externally supplied reset signal to the latch section, and an output control section for outputting a high potential or low potential supplied as a power supply for operating the flip-flop.

With this configuration, an output signal of the flip-flop becomes high level (or low level) according to a change in a latched signal (input signal supplied from the gating section) latched in the latch circuit, whereas a low level (or high level) output signal is provided by outputting a high potential or low potential supplied as a power supply for operating the flip-flop.

For example, an output signal of the flip-flop falls at the rise of an input signal latched by the latch circuit. Upon canceling the latch state of the latch circuit with a reset signal, a high potential supplied as an operating power supply of the flip-flop is output as an output signal by the output control section.

In this case, a fall time of the output signal can be reduced by designing the latch circuit in favor of falling characteristics. On the other hand, a rise time of the output signal can be reduced by improving the driving capability of the output control section.

Namely, in a flip-flop configured as above, the falling and rising characteristics of the output signal are separately dependent on the latch circuit and the output control section, allowing for completely independent adjustment. As a result, a flip-flop is obtained that can improve its rising and falling characteristics at the same time.

A shift register according to an embodiment of the present invention is provided by connecting the flip-flops in multiple stages.

With this configuration, the flip-flops used in the shift register can improve their rising and falling characteristics, and thereby reduces a signal delay in the shift register.

An active-matrix display device according to an embodiment of the present invention includes a scan signal line driving circuit and a data signal line driving circuit, at least one of which uses a shift register of an embodiment of the invention.

With this configuration, using the shift register in the data signal line driving circuit reduces a delay in a sampling signal generated by the shift register. There accordingly will be no shift in the timings of the sampling signal and the data signal fed through data feed lines. With no timing shift, desired data can be stably applied to the source lines. On the other hand, using the shift register in the scan signal line driving circuit makes it easier to time the generated scan signal of the shift register with the data signal supplied to the source lines, thereby realizing stable operation.

For a fuller understanding of the nature and advantages of the invention, reference should be made to the ensuing detailed description taken in conjunction with the accompanying drawings.

DESCRIPTION OF THE EXEMPLARY EMBODIMENTS

The following will describe exemplary embodiments of the present invention with reference to the attached drawings.

Figure 2:
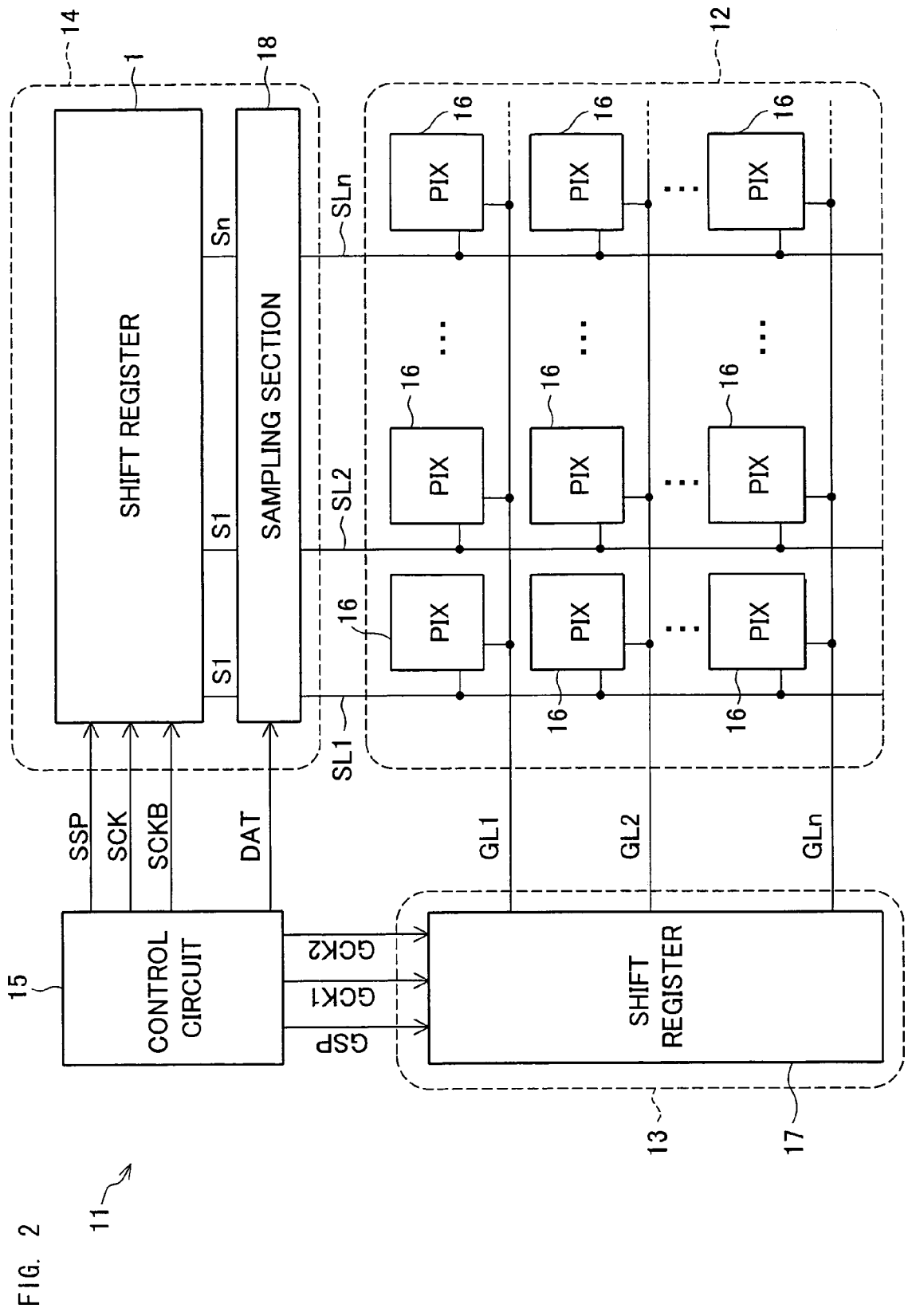
FIG. 2 is a schematic diagram showing a structure of an image display device using a shift register in its driving circuits.

FIG. 2 illustrates an exemplary structure of an image display device according to an embodiment of the present invention. An image display device 11 shown in FIG. 2 includes a display section 12, a scan signal line driving circuit 13, a data signal line driving circuit 14, and a control circuit 15.

The display section 12 includes n scan signal lines GL (GL1, GL2, . . . , GLn) parallel to one another, n data signal lines SL (SL1, SL2, . . . , SLn) parallel to one another, and pixels ("PIX" in FIG. 2) 16 disposed in a matrix. Each pixel 16 is formed in an area surrounded by adjacent two scan signal lines GL and adjacent two data signal lines SL. It is to be noted that even though the number of lines n is the same for the scan signal lines GL and the data signal lines SL for convenience of explanation, the scan signal lines GL and the data signal lines SL may be provided in different numbers as well.

The scan signal line driving circuit 13 includes a shift register 17. The shift register 17 generates scan signals to be supplied to the scan signal lines GL1, GL2, . . . connected to respective rows of the pixels 16, wherein the scan signals are generated sequentially according to two kinds of clock signals GCK1 and GCK2, and a start pulse signal GSP, all supplied from the control circuit 15. A circuit structure of the shift register 17 will be described later.

The data signal line driving circuit 14 includes a shift register 1 and a sampling section 18. From the control circuit 15, the shift register 1 receives two kinds of clock signals SCK and SCKB which are out of phase with each other, and a start pulse signal SSP. The sampling section 18 receives a video signal DAT from the control circuit 15. In the data signal line driving circuit 14, the sampling section 18 samples the video signal DAT according to output signals S1 through Sn supplied from the respective stages of the shift register 1, and resulting video data is supplied to the data signal lines SL1, SL2, . . . connected to respective columns of the pixels 16.

The control circuit 15 generates various control signals for controlling the operations of the scan signal line driving circuit 13 and the data signal line driving circuit 14. The clock signals GCK1, GCK2, SCK, SCKB, the start signals GSP, SSP, and the video signals DAT are some of the control signals generated by the control circuit 15.

In the image display device 11, it is to be noted that the scan signal line driving circuit 13, the data signal line driving circuit 14, and the pixels 16 in the display section 12 all include a switching element.

Figure 3:
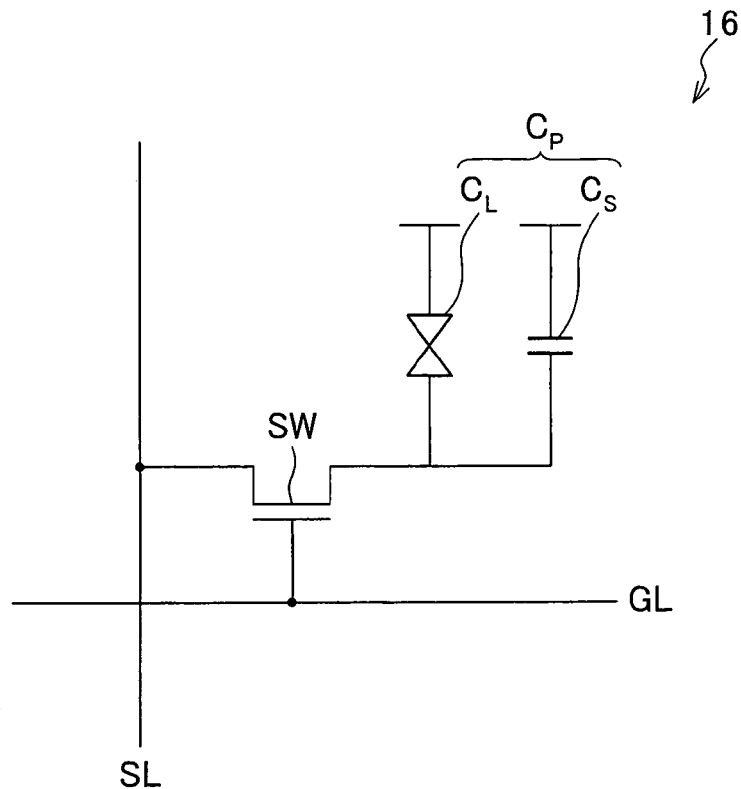
FIG. 3 is a diagram showing a structure of a pixel in the image display device.

In the case where the image display device 11 is an active-matrix liquid crystal display device, each pixel 16 includes a pixel transistor SW realized by a field-effect transistor, and a pixel capacitor $C_P$ including a liquid crystal capacitor $C_L$ (and optionally an auxiliary capacitor $C_S$), as shown in FIG. 3. Here, the pixel 16 is configured so that the data signal line SL is connected to one electrode of the pixel capacitor $C_P$ via the drain and source of the pixel transistor SW, and the gate of the pixel transistor SW is connected to the scan signal line GL. The other electrode of the pixel capacitor $C_P$ is connected to a common electrode line (not shown) common to all pixels.

Here, assume a pixel 16, PIX (i, j), connected to a data signal line SLi and a scan signal line GLj, where i and j are independently arbitrary integers that satisfy $1 \leq i$, $j \leq n$. In the PIX (i, j), when the scan signal line GLj is selected, the pixel transistor SW is turned on, and a voltage is applied to the pixel capacitor $C_P$ according to the video data applied to the data signal line SLi. The applied voltage to the liquid crystal capacitor $C_L$ of the pixel capacitor $C_P$ modulates transmittance or reflectance of the liquid crystal. Thus, by selecting a scan signal line GLj and applying a signal voltage to a data signal line SLi according to video data, a display state of the PIX (i, j) can be varied according to the video data.

In the image display device 11, the scan signal line driving circuit 13 selects a scan signal line GL, and the data signal line driving circuit 14 outputs video data via data signal lines SL to the pixels 16 selected by the scan signal line GL. As a result, the video data is written in the pixels 16 connected to the selected scan signal line GL. Further, the scan signal line driving circuit 13 sequentially selects scan signal lines GL, and the data signal line driving circuit 14 outputs video data to data signal lines SL. As a result, the video data is written in all pixels 16 in the display section 12, causing the display section 12 to display an image according to the video signal DAT.

The video data for the pixels 16 is sent time-sequentially in the form of the video signal DAT from the control circuit 15 to the data signal line driving circuit 14. The data signal line driving circuit 14 extracts video data from the video signal DAT at timings based on the clock signal SCK, the clock signal SCKB, and the start pulse SSP. The clock signal SCK has a predetermined period with a duty ratio of no greater than 50% (with a Low period shorter than a High period in the embodiments). The clock signal SCKB is 180° out of phase from the clock signal SCK.

Specifically, in response to the start pulse SSP, the shift register 1 of the data signal line driving circuit 14 sequentially outputs a pulse of half a clock period by shifting it in synchronism with the clock signals SCK and SCKB, and thereby generates output signals S1 through Sn, which are shifted from one another by one clock. The sampling section 18 of the data signal line driving circuit 14 extracts video data from the video signal DAT at the timings of the output signals S1 through Sn.

On the other hand, the shift register 17 of the scan signal line driving circuit 13, in response to the start pulse GSP, sequentially outputs a pulse of half a clock period by shifting it in synchronism with the clock signals GCK1 and GCK2, thereby outputting scan signals, shifted from one another by one clock, to the respective scan signal lines GL1 through GLn.

Figure 22:
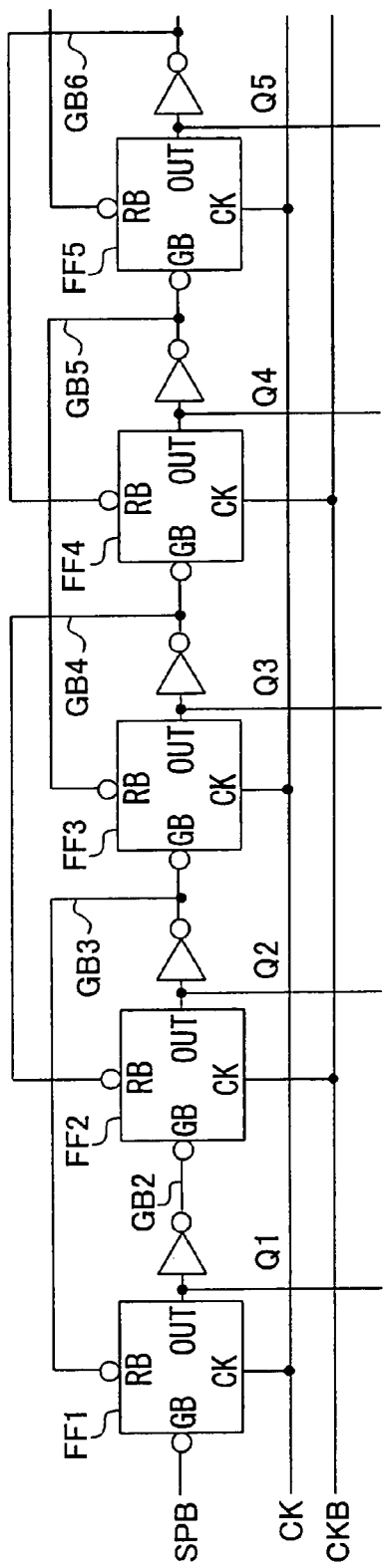
FIG. 22 is a block diagram showing an exemplary structure of a shift register using an RS flip-flop.
Figure 23:
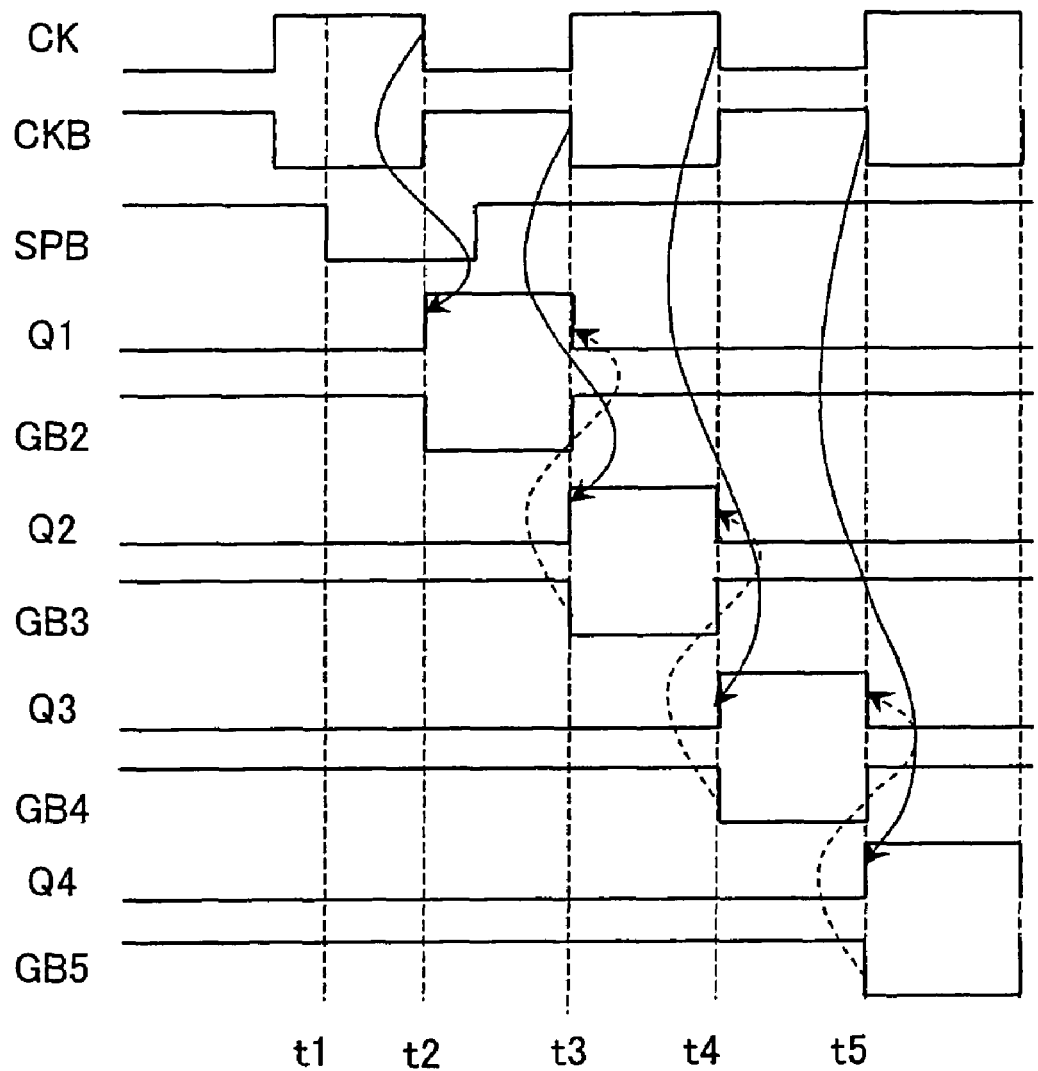
FIG. 23 is a timing chart showing waveforms of input and output signals of the shift register shown in FIG. 22.

The shift register 1 of the data signal line driving circuit 14, and the shift register 17 of the scan signal line driving circuit 13 can have an overall structure similar to that shown in FIG. 22. However, as described in the embodiments of the present invention, the shift register 1 or 17 employs an RS flip-flop structure different from conventional structures. Specific examples of flip-flops according to the present invention are described in the First through Fifth Embodiments below.

First Embodiment

Figure 1:
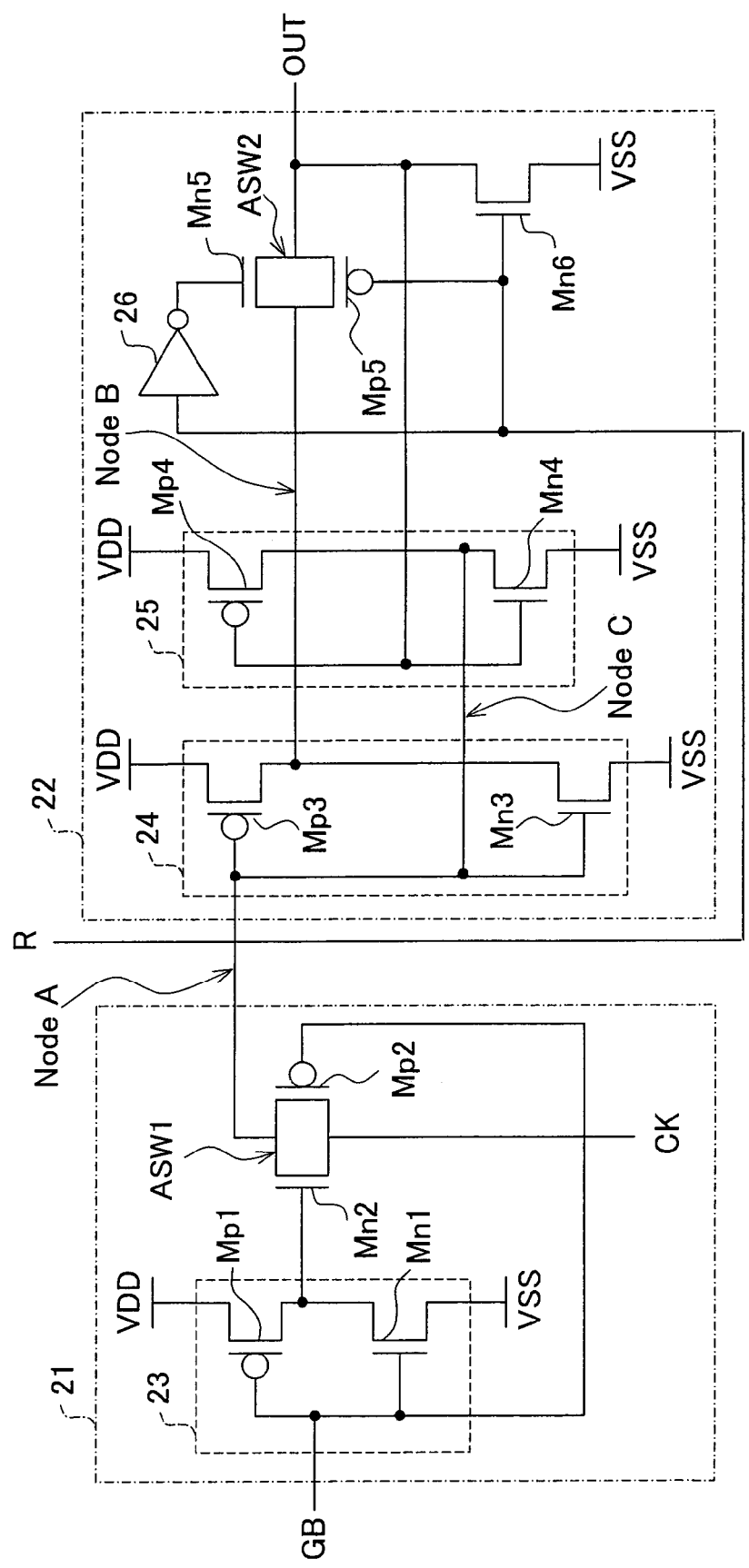
FIG. 1 is a circuit diagram showing a structure of an RS flip-flop according to a First Embodiment of the present invention.

Referring to FIG. 1, the following will describe an exemplary structure of an RS flip-flop according to the First Embodiment.

The RS flip-flop shown in FIG. 1 has two major parts, a gating section 21 and a latch section 22.

The gating section 21 includes an inverter circuit 23 realized with a p-type transistor Mp1 and an n-type transistor Mn1 (hereinafter, p-type transistors and n-type transistors will be denoted by Mp and Mn, respectively), which are connected in series between power supply VDD (high potential) and VSS (low potential). A control terminal GB is connected to the input side of the inverter circuit 23, i.e., to the gates of the Mp1 and Mn1.

Between an input terminal CK and Node A is connected a CMOS analog switch ASW1 connecting Mn2 and Mp2 in parallel. In the analog switch ASW1, the gate of the Mn2 is connected to the output of the inverter circuit 23 (i.e., the junction connecting the source of Mp1 and the drain of Mn1), and the gate of Mp2 is connected to the control terminal GB.

Supplying VDD to the gate of Mn2 in the ASW1 connects the source and drain of Mn2, while the source and drain of Mn2 are cut off when VSS is supplied. On the other hand, supplying VSS to the gate of Mp2 connects the source and drain of Mp2, while the source and drain of Mp2 are cut off when VDD is supplied. By these operations of Mn2 and Mp2, the analog switch ASW1 controls the supply of input signal CK. The Node A is the output of the gating section 21.

The latch section 22 includes an inverter circuit 24 and an inverter circuit 25, each provided between power supply VDD and VSS. The inverter 24 includes Mp3 and Mn3, and the inverter 25 includes Mp4 and Mn4. The input of the inverter circuit 24 is connected to the output of the inverter circuit 25. The output of the gating section 21, i.e., the Node A, is connected to the input of the inverter circuit 24. The output of the inverter circuit 24 is Node B, and the output of the inverter circuit 25 is Node C.

Between the output of the inverter circuit 24 and the output terminal OUT of the RS flip-flop is connected a CMOS analog switch ASW2 (latch canceling section) connecting Mn5 and Mp5 in parallel. In the analog switch ASW2, the gate of Mn5 is connected to a control terminal R via an inverter 26, and the gate of Mp5 is connected to the control terminal R.

The junction between the analog switch ASW2 and the output terminal OUT is connected to the input of the inverter circuit 25. Thus, while the analog switch ASW2 is on, the output of the inverter circuit 24 and the input of the inverter circuit 25 are connected to each other. That is, the inverter circuit 24 and the inverter circuit 25 together realize a latch circuit by connecting their inputs and outputs between each other.

Between the power supply VSS and output terminal OUT is an Mn6 (output control section), whose gate is connected to the control terminal R.

Figure 4:
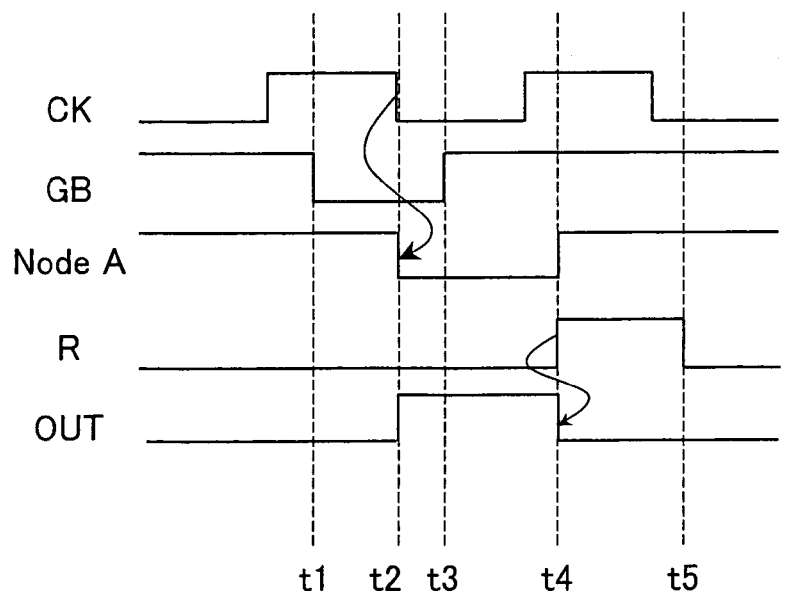
FIG. 4 is a timing chart showing waveforms of input and output signals of the flip-flop shown in FIG. 1.

Referring to FIG. 4, the following will describe operations of the RS flip-flop shown in FIG. 1.

A timing chart of FIG. 4 assumes that a control signal GB, a clock signal CK, and a reset signal R are respectively input to the control terminal GB, input terminal CK, and reset terminal R of the RS flip-flop.

First, when the control signal GB falls to Low (VSS) at time t1, the output of the inverter circuit 23 becomes VDD, and the VDD is supplied to the gate of Mn2 in the analog switch ASW1. Here, the gate of Mp2 in the analog switch ASW1 receives VSS (control signal GB). As a result, the analog switch ASW1 closes, supplying the clock signal CK to the Node A.

When the clock signal CK becomes Low at time t2, the potential of the Node A becomes Low. The low level is input to the gate of the inverter circuit 24 including Mn3 and Mp3, bringing the Node B—the output of the inverter circuit 24—to high level. Here, since the reset signal R remains low, low level is applied to the gate of Mp5 in the analog switch ASW2 including Mp5 and Mn5. The Mn5 receives an inverted high-level reset signal R produced by the inverter circuit 26. In this state, the analog switch ASW2 is closed, and the signal from Node B becomes the output OUT of the RS flip-flop through the analog switch ASW2.

The signal from the node B is also applied to the respective gates of Mn4 and Mp4 in the inverter circuit 25, bringing the Node C—the output of the inverter circuit 25—to low level. As a result, the inverter circuit 24 and the inverter circuit 25 together serve as a latch circuit.

When the control signal GB becomes high level at time t3, the analog switch ASW1 opens, stopping supply of the clock signal CK to the Node A. Here, since the reset signal R remains low, the analog switch ASW2 remains closed and the output OUT is held at high level by the latch circuit realized by the inverter circuits 24 and 25.

When the reset signal R becomes high level at time t4, the analog switch ASW2 opens and the Mn6 is turned on. As a result, the output terminal OUT is cut off from the Node B, and is connected to the power supply VSS via Mn6. As a result, the output OUT becomes low level. Further, with the analog switch ASW2 open, the output of the inverter circuit 24 is cut off from the input of the inverter circuit 25, canceling the latch state of the inverter circuits 24 and 25. Here, the input of the inverter circuit 25 is low and the Node C is high. Accordingly, the Node B—the output of the inverter circuit 24—becomes low.

After time t5, the reset signal R is low level. Here, the Mn6 is turned off, and the output terminal OUT is cut off from the power supply VSS. However, since the analog switch ASW2 is closed, the inverter circuits 24 and 25 assume a latch state again, and the output OUT is maintained at low level.

The following considers the rising characteristics of the output OUT in the RS flip-flop having the structure as described in this embodiment. With a low-level control signal GB supplied to the RS flip-flop, the node A becomes low when the clock signal CK falls. Here, the rise time of the output OUT can be reduced by providing a greater channel width for Mp3 than for Mn3. This improves driving capability of Mp3 greater than Mn3, and thereby improves the rising characteristics.

Figure 24:
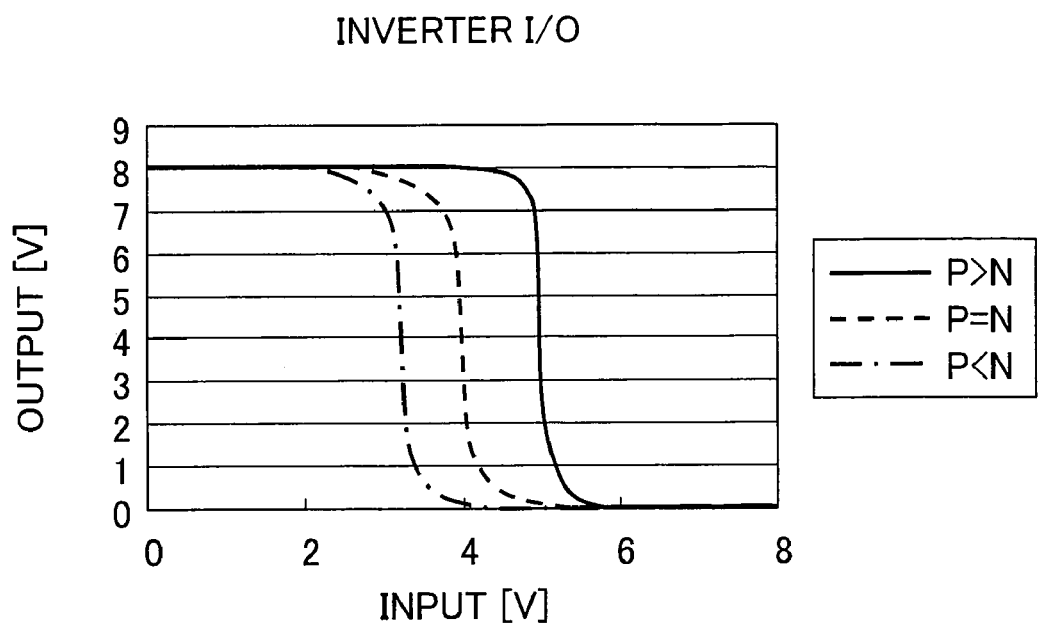
FIG. 24 is a graph representing input and output characteristics of an inverter.
Figure 25:
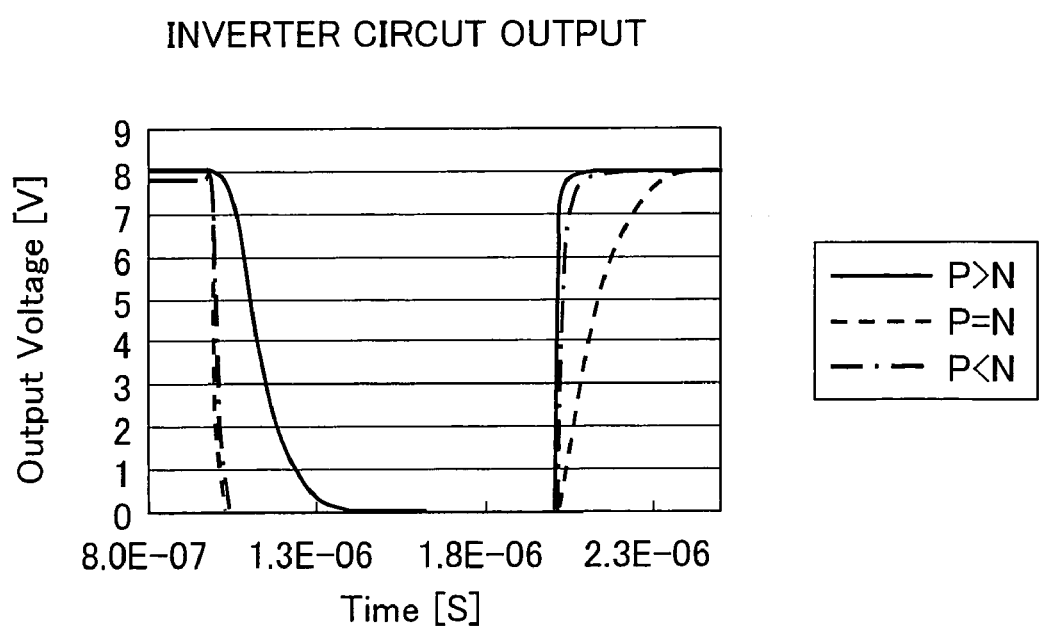
FIG. 25 is a graph representing transient characteristics (output waveforms) of the inverter.

FIG. 24 shows input and output characteristics obtained by varying the capability (current flow) of a Pch transistor (Mp) and Nch transistor (Mn) of the inverter. FIG. 25 shows transient characteristics (output waveforms) of these transistors. In FIG. 24 and FIG. 25, the following parameters are used.

(1) Mp has a higher capability than Mn (P>N)
(2) Mp and Mn have substantially the same capability (P=N)
(3) Mn has a higher capability than Mp (P<N)

Figure 26:
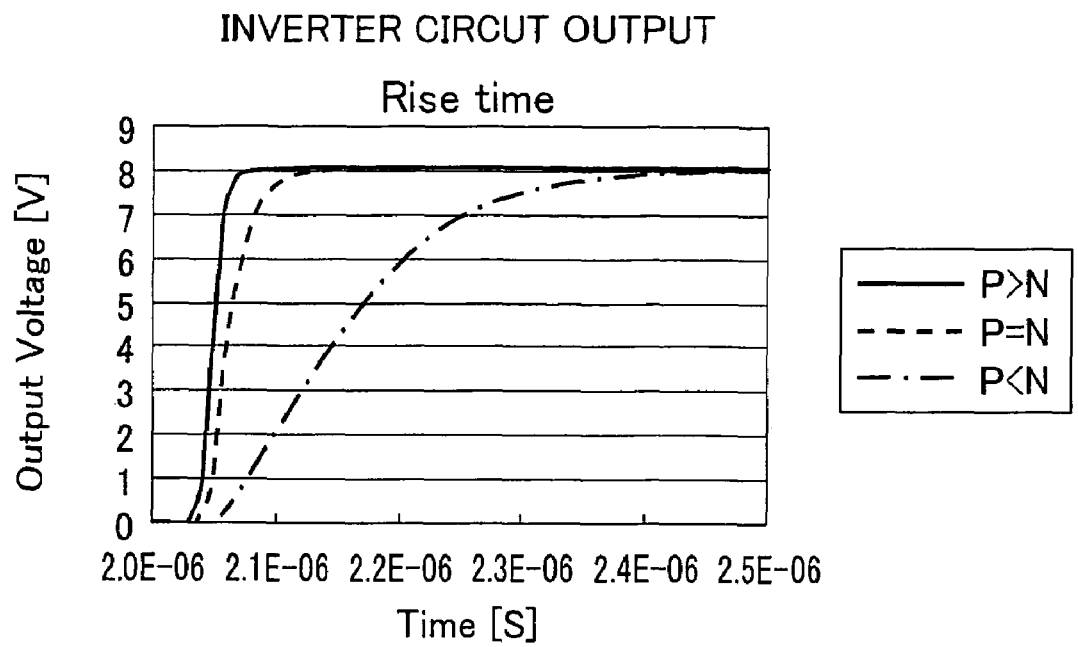
FIG. 26 is a graph representing rising waveforms of output waveforms of the inverter of FIG. 25.
Figure 27:
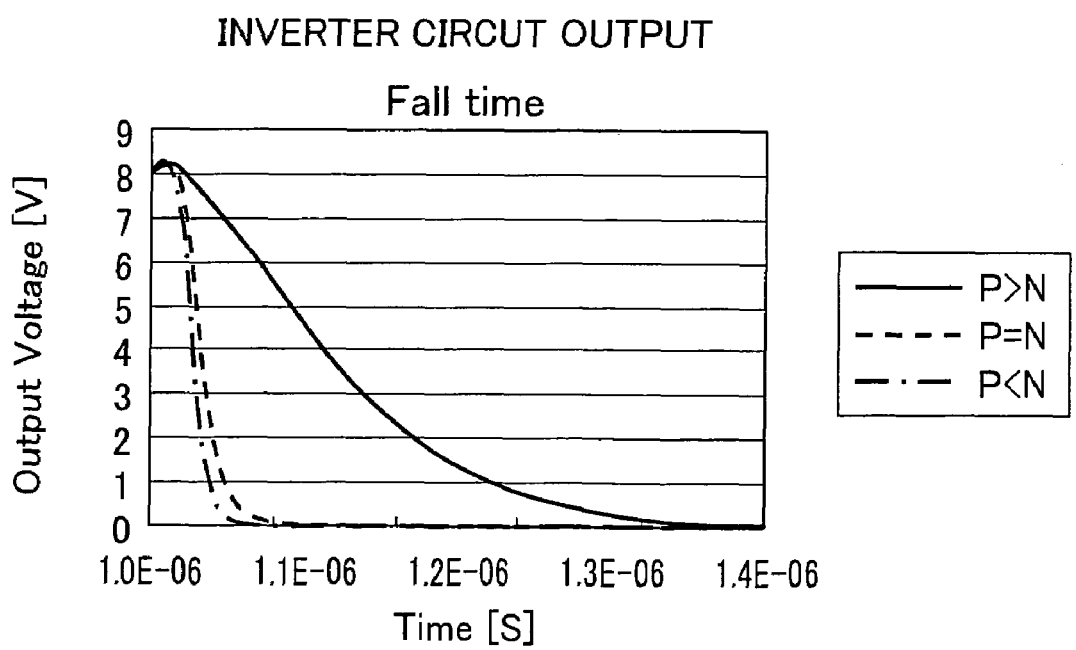
FIG. 27 is a graph representing falling waveforms of output waveforms of the inverter of FIG. 25.

FIG. 26 and FIG. 27 are graphs representing rising waveforms and falling waveforms, respectively, of the output waveforms of the inverter shown in FIG. 25. The following information can be obtained from these graphs.

For (P>N), a good rising characteristic is obtained but falling characteristic is poor.

For (P=N), the rising and falling characteristics are essentially the same (typical inverter)

For (P<N), a good falling characteristic is obtained but rising characteristic is poor.

As can be seen from this, it is difficult to improve both rising and falling characteristics in the same inverter. As such, in the RS flip-flop according to an embodiment of the present invention, the inverter 24 realized by Mn3 and Mp3 has an improved rising characteristic. This is attained by providing a greater channel width for Mp3 than for Mn3 and thereby improving the driving capability of Mp3 more than Mn3, by taking advantage of the fact that the channel width of Mp3 influences only the rising characteristic of the output OUT.

On the other hand, as for the falling characteristics of the output OUT, the fall time can be reduced by improving driving capability of Mn6 that brings the output OUT to low level in response to the reset signal R. This can be achieved by increasing the channel width of Mn6.

The Mn6 is turned on as the reset signal R rises. Here, since the output OUT is completely cut off from the circuits other than the Mn6 by the operation of the analog switch ASW2, the output OUT is only affected by the Mn6 in terms of electricity. That is, the falling characteristics only depend on driving capability of the Mn6.

With the described structure, the RS flip-flop can independently adjust the falling characteristics and rising characteristics of the output OUT, thereby greatly reducing a delay time of the output signal Q when used in shift registers, as compared with conventional structures.

Second Embodiment

Figure 5:
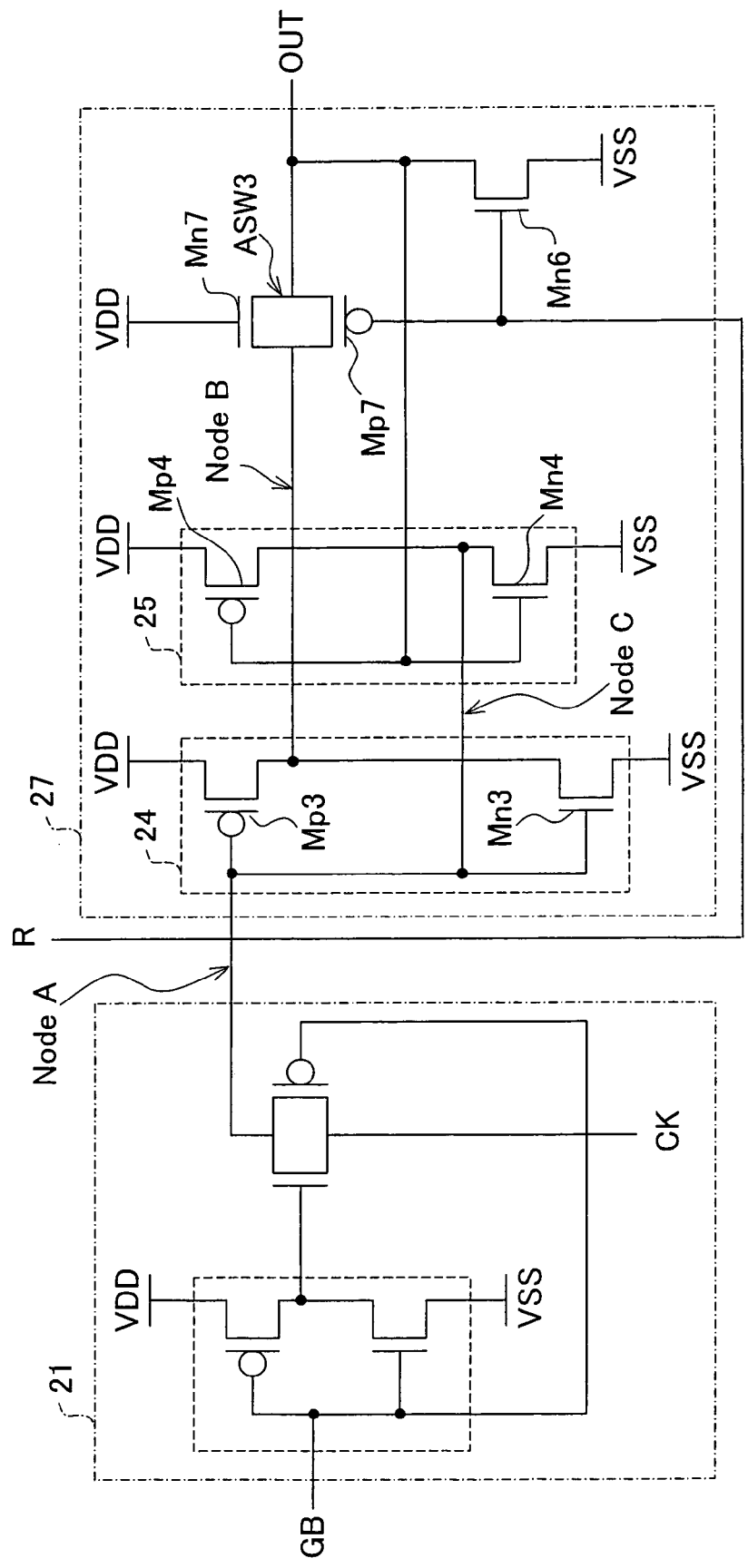
FIG. 5 is a circuit diagram showing a structure of an RS flip-flop according to a Second Embodiment of the present invention.

Referring to FIG. 5, the following will describe an exemplary structure of an RS flip-flop according to another embodiment of the invention.

The RS flip-flop shown in FIG. 5 includes two major parts, a gating section 21 and a latch section 27. As to a structure and operations of the gating section 21, no further explanation will be made because they are essentially the same as those in the RS flip-flop of the First Embodiment described with reference to FIG. 1.

The latch section 27 is similar to the latch 22 but includes an analog switch ASW3 instead of the analog switch ASW2. It is to be noted that elements of the latch section 27 having similar structures as those of the latch section 22 are given the same reference symbols and further explanations thereof will be omitted.

The analog switch ASW3 is connected between the output of the inverter 24 and the output terminal OUT of the RS flip-flop, and it serves as a CMOS analog switch connecting Mn7 and Mp7 in parallel. In the analog switch ASW3, the gate of the Mn7 is connected to the power supply VDD, and the gate of the Mp7 is connected to the reset terminal R.

Figure 6:
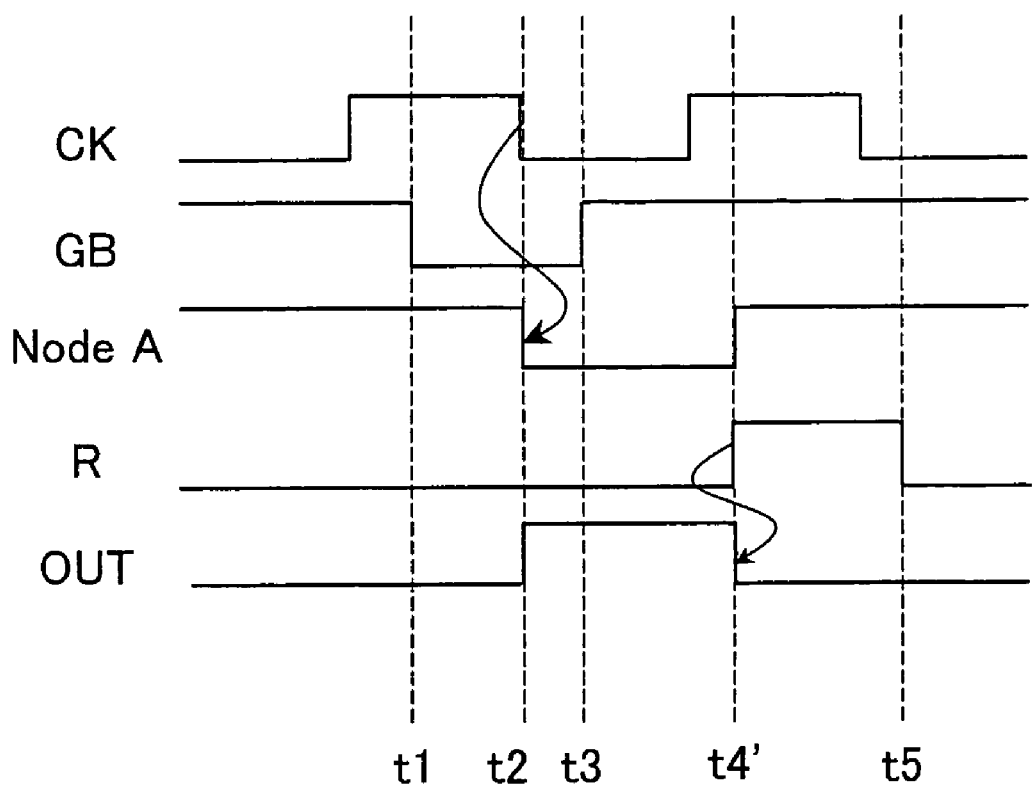
FIG. 6 is a timing chart showing waveforms of input and output signals of the flip-flop shown in FIG. 5.

Referring to FIG. 6, the following describes operations of the RS flip-flop shown in FIG. 5.

A timing chart of FIG. 6 assumes that a control signal GB, a clock signal CK, and a reset signal R are respectively input to the control terminal GB, input terminal CK, and reset terminal R of the RS flip-flop.

First, when the control signal GB falls to low (VSS) at time t1, the output of the inverter circuit 23 becomes VDD, and the VDD is supplied to the gate of Mn2 in the analog switch ASW1. Here, the gate of Mp2 in the analog switch ASW1 receives VSS (control signal GB). As a result, the analog switch ASW1 closes, supplying the clock signal CK to the Node A.

When the clock signal CK becomes low at time t2, the potential of the Node A becomes low. The low level is input to the gate of the inverter circuit 24 including Mn3 and Mp3, bringing the Node B—the output of the inverter circuit 24—to high level. Here, since the reset signal R remains low, low level is applied to the gate of the Mp7 and high level (power supply VDD) is applied to the Mn7 in the analog switch ASW3. In this state, the analog switch ASW3 is closed, and the signal from Node B becomes the output OUT of the RS flip-flop through the analog switch ASW3.

The signal from the node B is also applied to the respective gates of Mn4 and Mp4 in the inverter circuit 25, bringing the Node C—the output of the inverter circuit 25—to low level. As a result, the inverter circuit 24 and the inverter circuit 25 together serve as a latch circuit.

When the control signal GB becomes high level at time t3, the analog switch ASW1 opens, stopping supply of the clock signal CK to the Node A. Here, since the reset signal R remains low, the analog switch ASW3 remains closed and the output OUT is held at high level by the latch circuit realized by the inverter circuits 24 and 25.

The operations from time t1 to t3 are the same as those of the RS flip-flop described with reference to FIG. 1.

When the reset signal R becomes high at time t4', the Mp7 in the analog switch ASW3 is turned off. Here, the Mn7 is also off because its gate and source both receive a high level immediately after the reset signal R has become high. Accordingly, the analog switch ASW3 opens and the output terminal OUT is cut off from the Node B. With the analog switch ASW3 open, the output of the inverter circuit 24 is cut off from the input of the inverter circuit 25, canceling the latch state of the inverter circuits 24 and 25.

With the reset signal R at high level, the Mn6 is turned on. As a result, the output OUT is connected to the power supply VSS via the Mn6, and the output OUT becomes low level. With the Mn6 turned on, the input of the inverter circuit 25 becomes low level, and accordingly the Node C and Node B become high and low, respectively. With the Node B at low level, the gate and source of the Mn7 in the analog switch ASW3 become high and low, respectively. With the Mn7 turned on, the output terminal OUT is connected to the Node B (low level). Here, the output terminal OUT is already at low level by the operation of the Mn6.

After time t5, the reset signal R is low level. Here, the Mn6 is turned off, and the output terminal OUT is cut off from the power supply VSS. However, since the analog switch ASW3 is closed, the inverter circuits 24 and 25 assume a latch state again, and the output OUT is maintained at low level.

The following considers the rising characteristics of the output OUT in the RS flip-flop having the structure as described in this embodiment. With a low-level control signal GB supplied to the RS flip-flop, the Node A becomes low level when the clock signal CK falls. Here, the rise time of the output OUT can be reduced by providing a greater channel width for Mp3 than for Mn3. This improves driving capability of Mp3 greater than Mn3, and thereby improves the rising characteristics.

On the other hand, as for the falling characteristics of the output OUT, the fall time can be reduced by improving driving capability of Mn6 that brings the output OUT to low level in response to the reset signal R. This can be achieved by increasing the channel width of the Mn6.

The Mn6 is turned on as the reset signal R rises. Here, immediately after the rise of the reset signal R, the output OUT is completely cut off from the circuits other than the Mn6 by the operation of the analog switch ASW3. As such, the output OUT is only affected by the Mn6 in terms of electricity. That is, the falling characteristics only depend on driving capability of Mn6.

With the described structure, the RS flip-flop can independently adjust the falling characteristics and rising characteristics of the output OUT, thereby greatly reducing a delay time of the output signal Q when used in shift registers, as compared with conventional structures.

The RS flip-flop of the structure shown in FIG. 6 is more advantageous than the RS flip-flop of the structure shown in FIG. 1 because it does not require an inverter 26 for operating the analog switch ASW2 and thereby enables the number of elements to be reduced.

Third Embodiment

Figure 7:
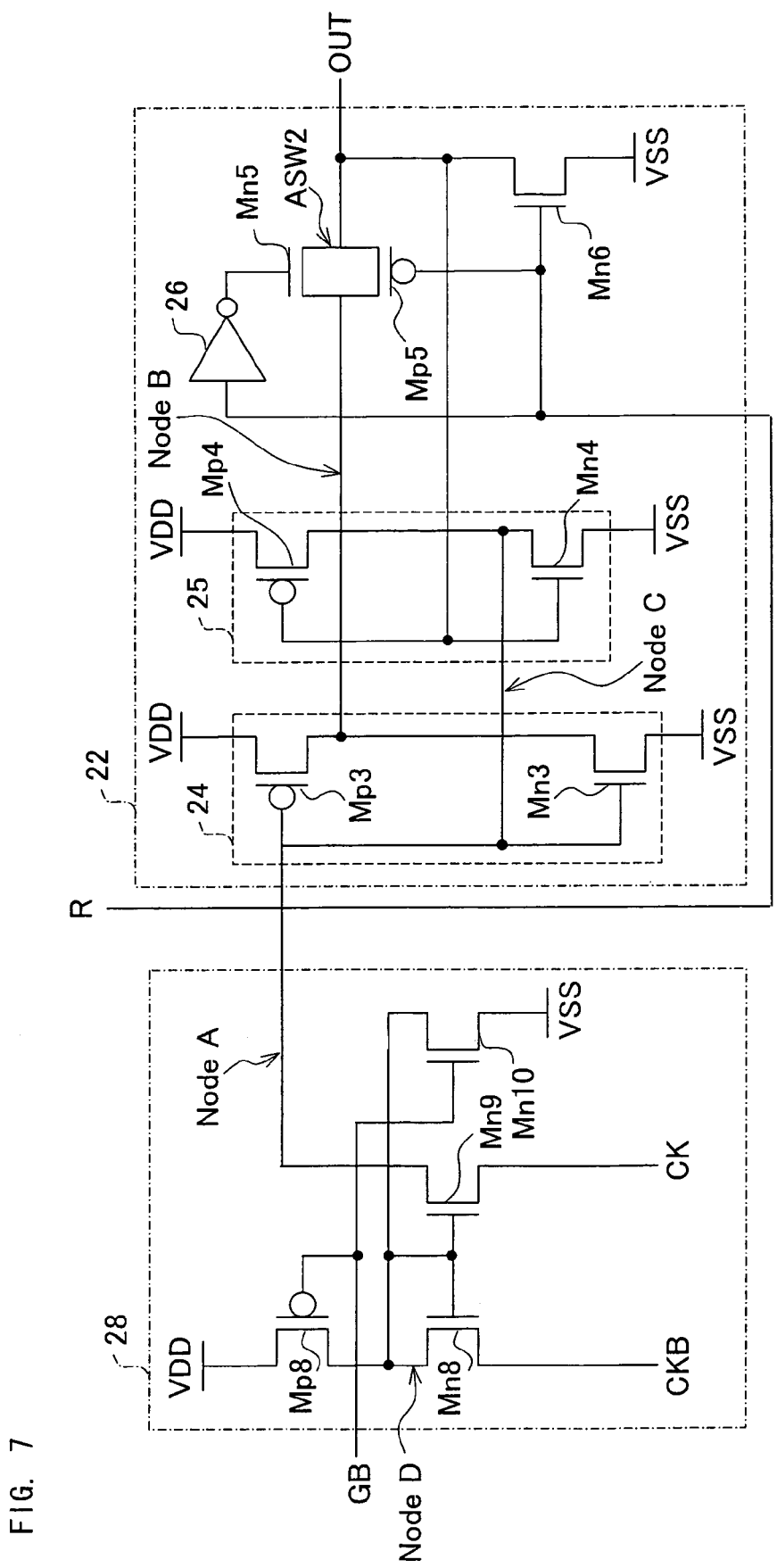
FIG. 7 is a circuit diagram showing a structure of an RS flip-flop according to a Third Embodiment of the present invention.

Referring to FIG. 7, the following will describe an exemplary structure of an RS flip-flop according to yet another embodiment of the invention.

The RS flip-flop shown in FIG. 7 includes two major parts, a gating section 28 and a latch section 22. As to a structure and operations of the latch section 22, no further explanation will be made because they are essentially the same as those in the RS flip-flop of the First Embodiment described with reference to FIG. 1.

The gating section 28 is structured such that it receives a control signal GB, a clock signal CK, and an inverted clock signal CKB, wherein the clock signal CK and inverted clock signal CKB have amplitudes smaller than that produced by VDD, which is a power supply of the flip-flop.

In the gating section 28, Mp8 and Mn8 are connected in series between the power supply VDD and the input terminal CKB, and an Mn9 is connected between the input terminal CK and the Node A (output of the gating section 28). An Mn10 is disposed between a power supply VSS and the junction (Node D) of an Mp8 source and an Mn8 drain. The respective gates of the Mp8 and Mn10 are connected to the control terminal GB. The gate of the Mn8 is connected to the Node D.

Figure 8:
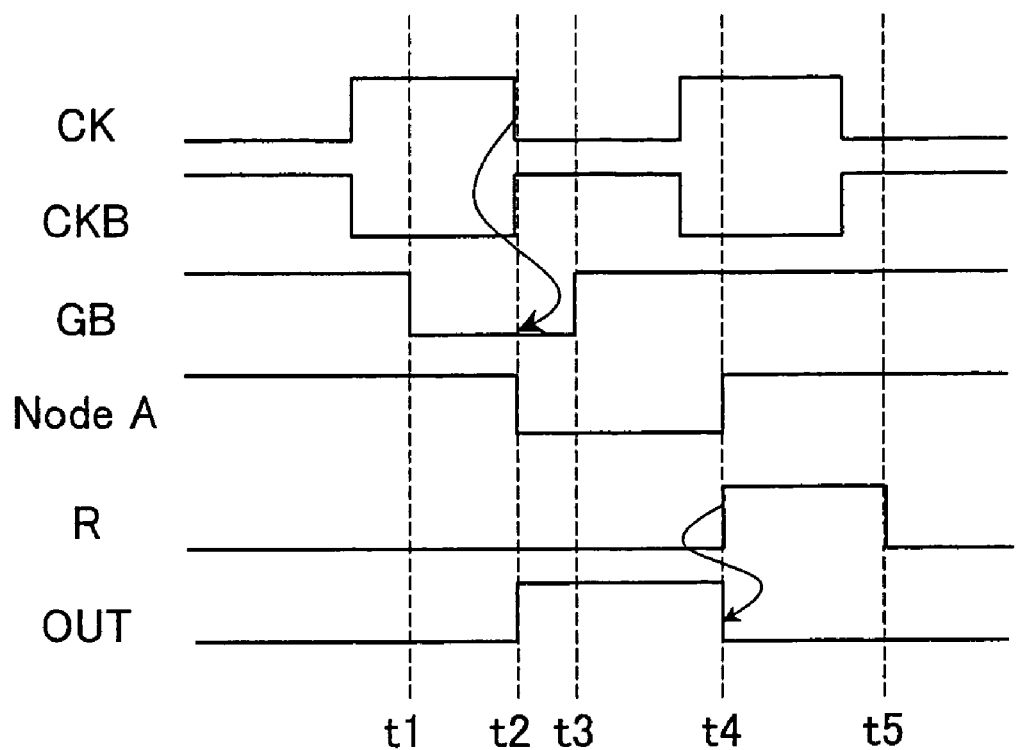
FIG. 8 is a timing chart showing waveforms of input and output signals of the flip-flop shown in FIG. 7.

Referring to FIG. 8, the following describes operations of the RS flip-flop shown in FIG. 7.

A timing chart shown in FIG. 8 assumes that the control signal GB, clock signal CK, inverted clock signal CKB, and reset signal R are respectively input to the control terminal GB, input terminal CK, input terminal CKB, and reset terminal R of the RS flip-flop. As an example, it is assumed here that the clock signal and inverted clock signal CKB each have an amplitude of 3.3 V, and that the VDD and VSS of the circuit are 12 V and 0 V, respectively. The threshold of Mn8 and Mn9 is 3 V.

When the control signal GB becomes low (VSS) at time t1, the Mp8 is turned on and Mn10 is turned off. Here, since the inverted clock signal CKB, the clock signal CK, and the threshold voltage of Mn8 are 0V, 3.3 V, and 3 V, respectively, the potential of the Node D is about 3 V, close to the threshold voltage of Mn8. Since the potential of the Node D is the gate potential of the Mn9, the Mn9 has a gate potential of about 3 V, and a source potential of 3.3 V. With the gate-source voltage of about 0.3 V, the Mn9 is turned off, and the Node A maintains its high level. In the latch section 22, the potential of the Node A is maintained at high level, and the output OUT is at low level, according to the operation described in the First Embodiment.

At time t2, when the inverted clock signal CKB and the clock signal CK become 3.3 V and 0 V, respectively, the node D becomes about 6.3 V by adding 3.3 V to the 3 V threshold of the Mn8. The potential of the node D is applied to the gate of Mn9. Here, since the source of Mn9 is 0 V, the Mn9 is turned on and the Node A becomes low.

At time t3, the control signal GB becomes high (VDD=12 V), turning off the Mp8, and turning on the Mn10. As a result, the respective gates of the Mn8 and Mn9 become low level (VSS=0), cutting off the clock signal CK and inverted clock signal CKB. Thus, when the control signal GB is at high level (VDD=12 V), the flip-flop will not be affected by the clock signal CK or inverted clock signal CKB regardless of the states of these clock signals. Here, since the Mn9 is off, no clock signal CK is supplied to the Node A. The Node A is maintained at low level by the latch section 22, and the output OUT of the latch section 22 remains at high level.

After time t4, the Mn9 is turned off, and accordingly the output of the gating section 28 does not affect the operation of the latch section 22. That is, the RS flip-flop operates in the same manner as that described in the First Embodiment.

Figure 9:
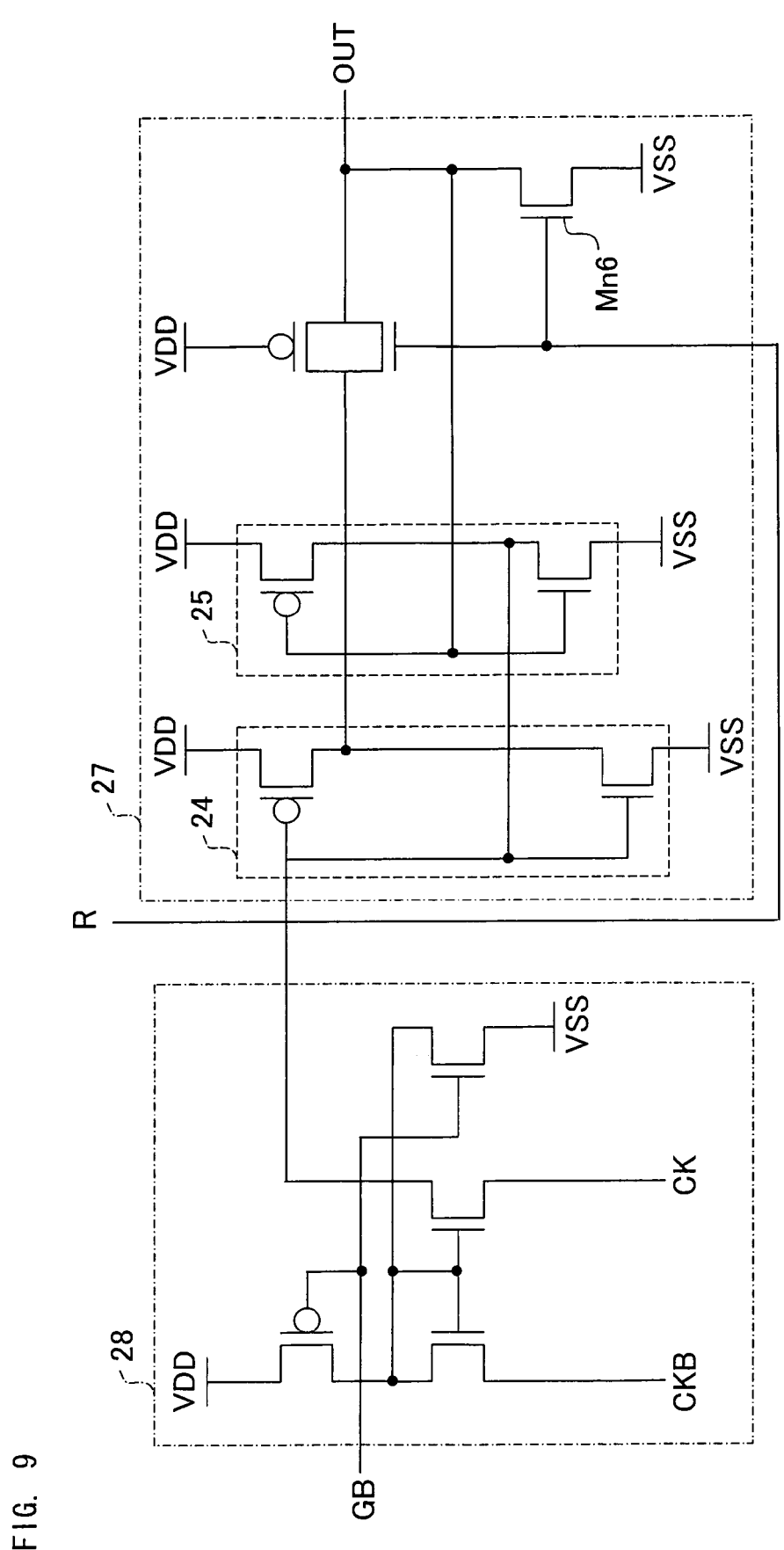
FIG. 9 is a circuit diagram showing another structure of the RS flip-flop according to the Third Embodiment of the present invention.

It is to be noted here that the structure of the RS flip-flop illustrated in FIG. 7, combining the gating section 28 and the latch section 22 of FIG. 1, may be modified such that the gating section 28 is combined with the latch section 27 shown in FIG. 5, as illustrated in FIG. 9. In this case, the relationship among various input and output signals in the RS flip-flop shown in FIG. 7 remains the same also in the RS flip-flop shown in FIG. 9.

Fourth Embodiment

Figure 10:
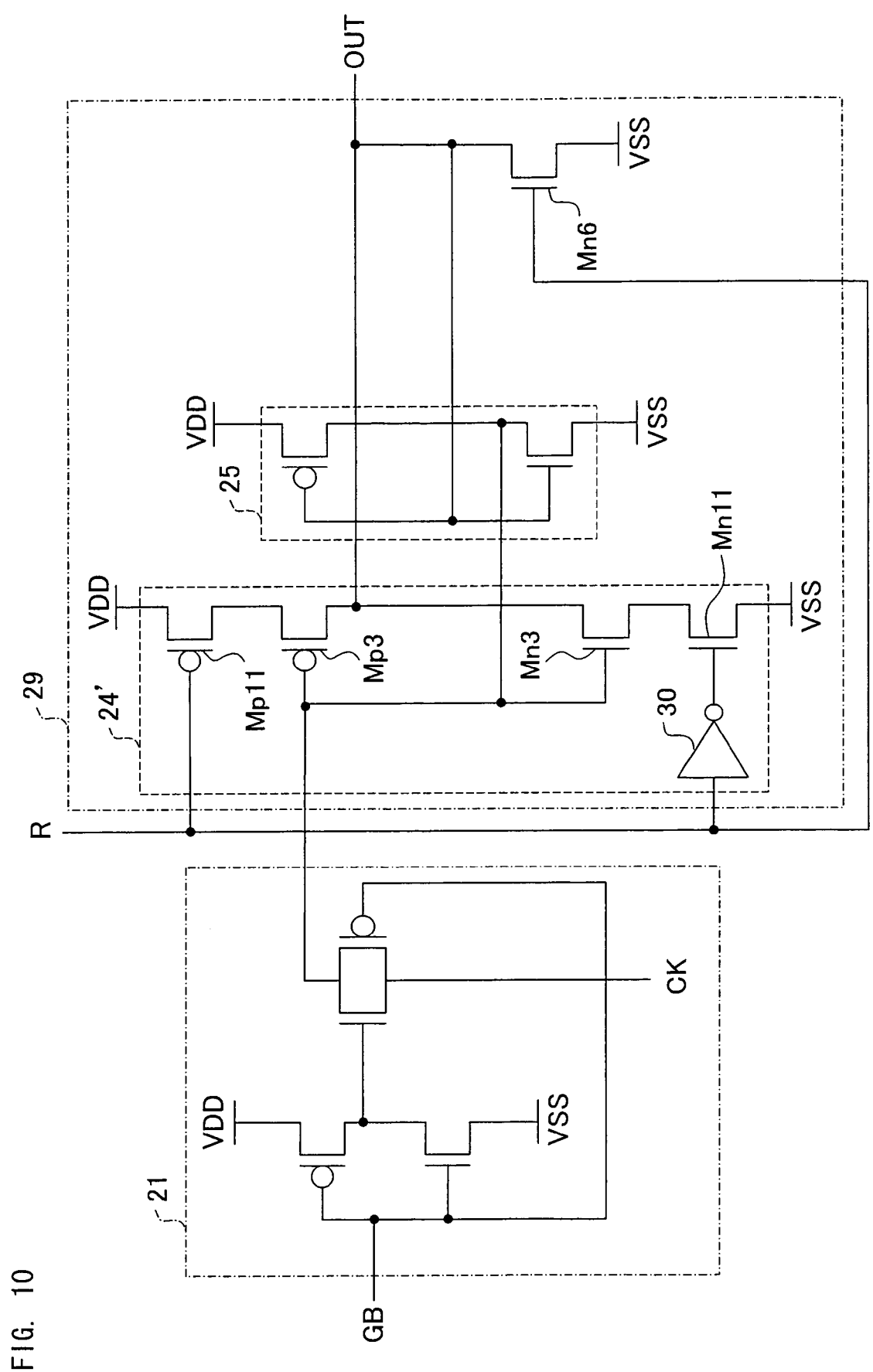
FIG. 10 is a circuit diagram showing a structure of an RS flip-flop according to a Fourth Embodiment of the present invention.

Referring to FIG. 10, the following will describe an exemplary structure of an RS flip-flop according to still another embodiment of the invention.

The RS flip-flop shown in FIG. 10 includes two major parts, a gating section 21 and a latch section 29. As to a structure and operations of the gating section 21, no further explanation will be made because they are essentially the same as those in the RS flip-flop of the First Embodiment described with reference to FIG. 1.

The latch section 29 is similar to the latch section 22 described in the First Embodiment but differs therefrom in that it includes a clocked inverter circuit 24' instead of the inverter circuit 24, and that it does not include the analog switch ASW2.

The clocked inverter circuit 24' is structured to further include Mp11 and Mn11 on the both sides of the Mp3 and Mn3 making up the inverter circuit 24. Specifically, the Mp11 is disposed between Mp3 and power supply VDD, and the Mn11 is disposed between Mn3 and power supply VSS. The gate of Mp11 directly receives the reset signal R, and the gate of Mn11 receives the reset signal R after it is inverted by the inverter 30.

In the RS flip-flop shown in FIG. 10, the Mp11 and Mn11 are off when the reset signal R is high. In this state, the Mp3 and Mn3 are cut off from the power supply VDD and VSS, and the circuit is in a float state. This is equivalent to the state where the analog switch ASW2 is turned off in the latch section 22 shown in FIG. 1. When the reset signal R is low, the Mp11 and Mn11 are on, and the Mp3 and Mn3 are connected to the power supply VDD and VSS. This is equivalent to the state where the analog switch ASW2 is turned on in the latch circuit 22 shown in FIG. 1.

In this manner, the RS flip-flop according to this embodiment operates in the same way as the RS flip-flop shown in FIG. 1. Further, with the circuit structure in which the analog switch ASW2 is omitted and the clocked inverter circuit 24' is used, the RS flip-flop requires a smaller circuit area.

Figure 11:
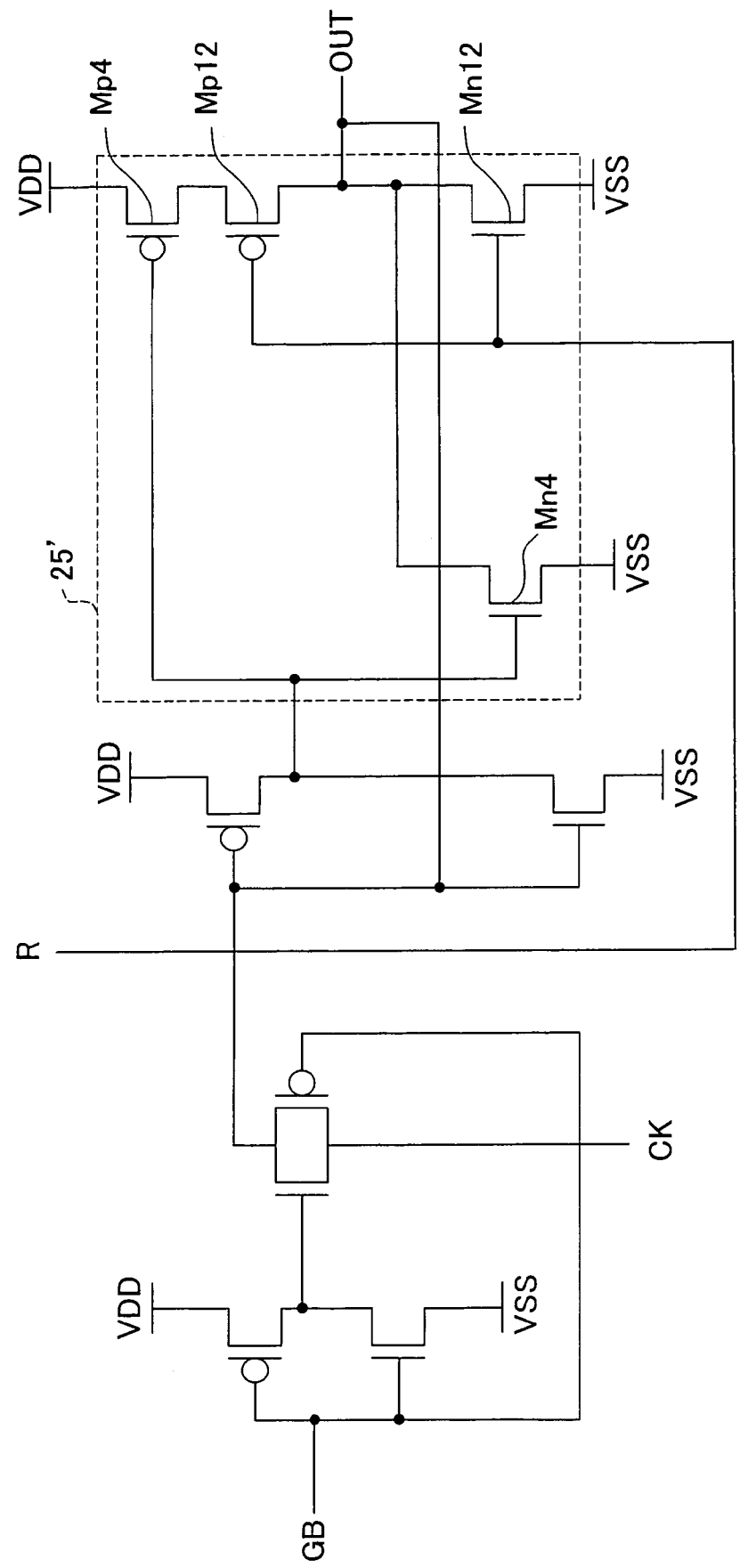
FIG. 11 is a circuit diagram showing another structure of the RS flip-flop according to the Fourth Embodiment of the present invention.
Figure 12:
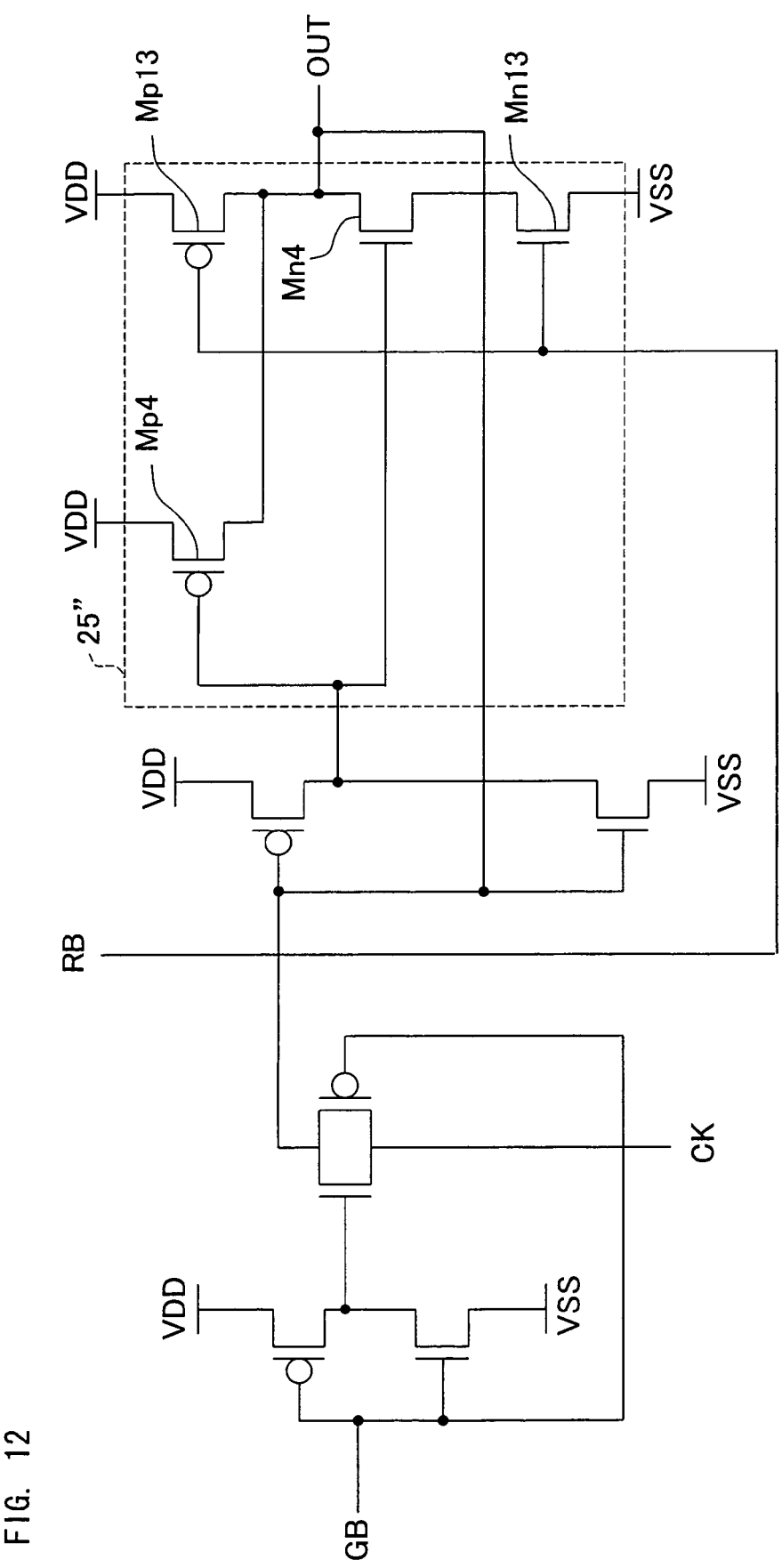
FIG. 12 is a circuit diagram showing yet another structure of the RS flip-flop according to the Fourth Embodiment of the present invention.

The RS flip-flop according to this embodiment may be modified to have structures illustrated in FIG. 11 and FIG. 12. In these modification examples, a clocked inverter circuit 25' (in the case of FIG. 11) or a clocked inverter circuit 25'' (in the case of FIG. 12) is used instead of the inverter circuit 25 of the structure shown in FIG. 1.

The clocked inverter circuit (NOR circuit) 25' includes an Mp12 connected between the output terminal OUT and Mp4, and an Mn12 connected parallel to the Mn4 between the power supply VSS and the output terminal OUT. The respective gates of Mp12 and Mn12 receive the reset signal R.

The clocked inverter circuit (NAND circuit) 25'' includes an Mp13 connected parallel to the Mp4 between the power supply VDD and the output terminal OUT, and an Mn13 connected between the power supply VSS and Mn4. The respective gates of Mp13 and Mn13 receive the reset signal RB.

Figure 13:
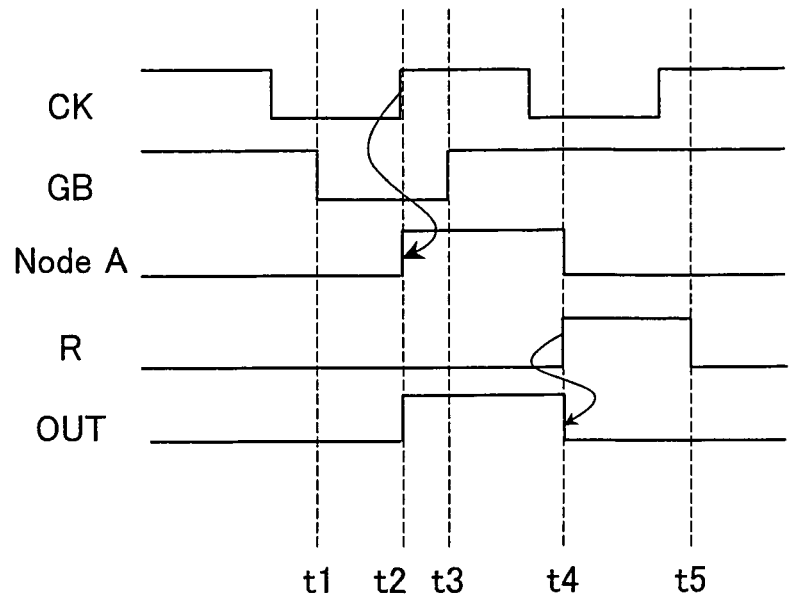
FIG. 13 is a timing chart showing waveforms of input and output signals of the flip-flop shown in FIG. 11.
Figure 14:
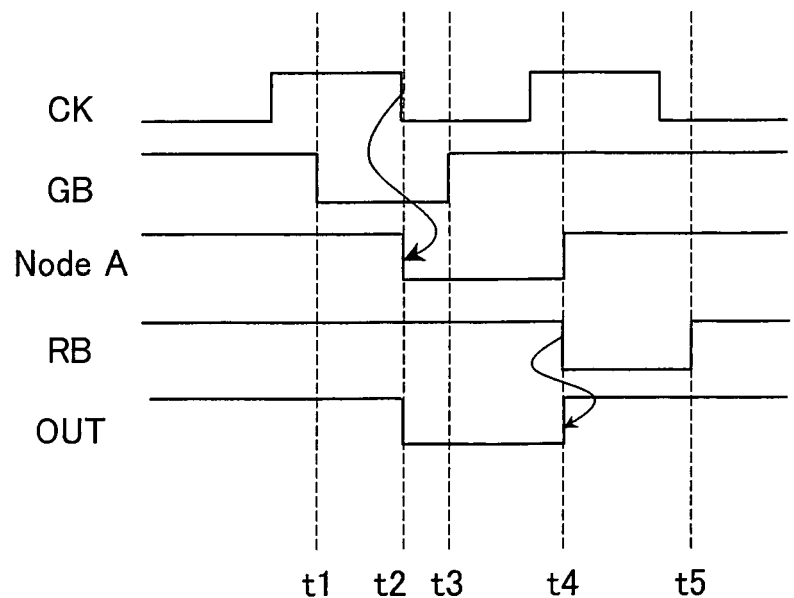
FIG. 14 is a timing chart showing waveforms of input and output signals of the flip-flop shown in FIG. 12.

FIG. 13 and FIG. 14 depict waveforms of input and output signals of the RS flip-flops shown in FIG. 11 and FIG. 12, respectively. Specific explanations of the RS flip-flops in regard to these input and output signals are omitted here.

Fifth Embodiment

In the RS flip-flops described through the foregoing First through Third Embodiments, the rising characteristics of the output are improved by the inverter (i.e., inverter circuit 24), while the falling characteristics are improved by the structure in which the output terminal OUT and the low potential VSS are connected to each other via the transistor Mn6.

Figure 15:
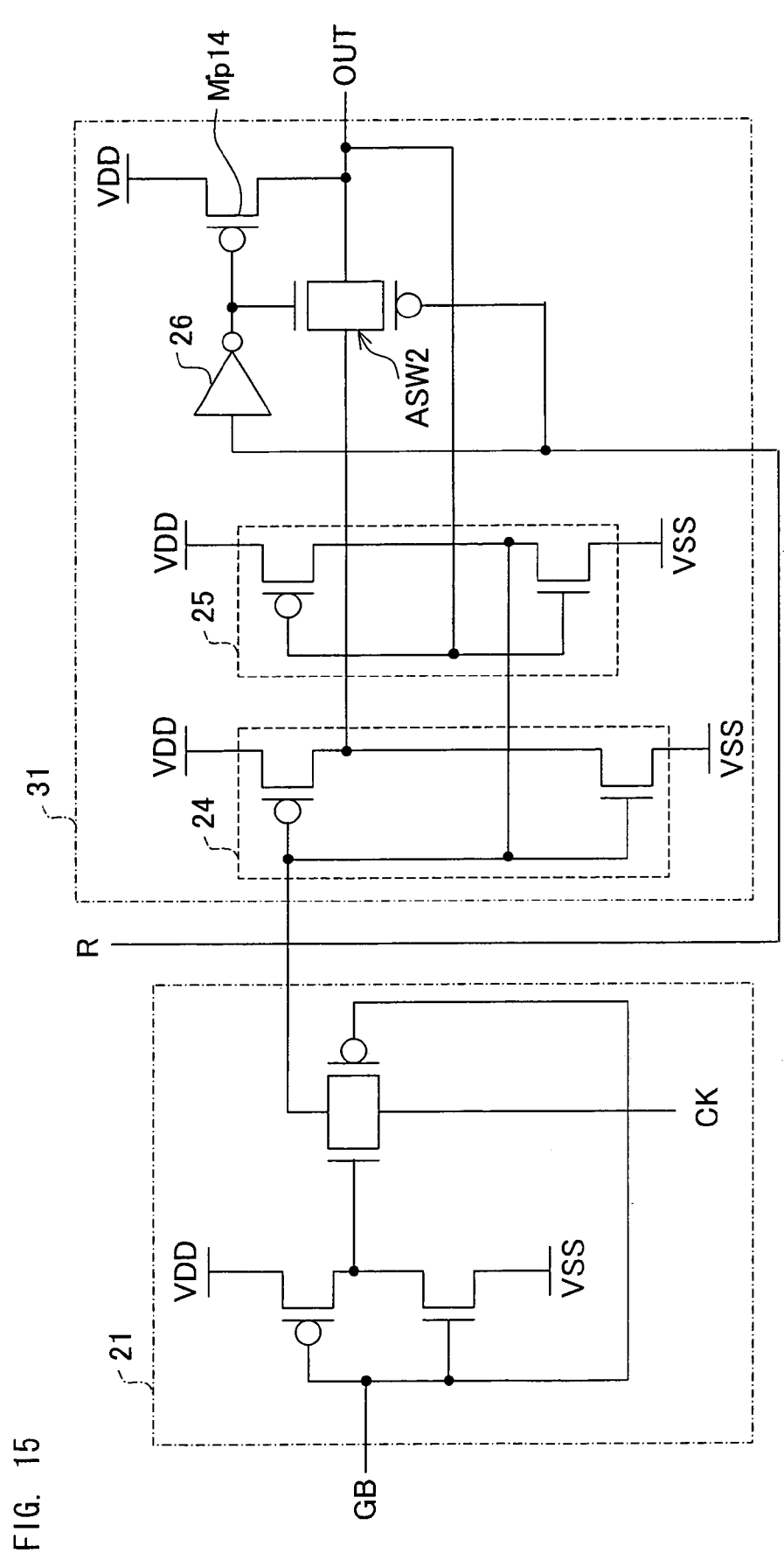
FIG. 15 is a circuit diagram showing a structure of an RS flip-flop according to a Fifth Embodiment of the present invention.

Conversely, the inverter may be adapted to improve the falling characteristics of the output, while the rising characteristics are improved by a structure in which the output terminal OUT and the high potential VDD are connected to each other via a transistor. FIG. 15 illustrates an exemplary structure of such an RS flip-flop.

The RS flip-flop shown in FIG. 15 includes two major parts, a gating section 21 (alternatively, gating section 28 shown in FIG. 7), and a latch section 31. As to a structure and operations of the gating section 21, no further explanation will be made because they are essentially the same as those in the RS flip-flop of the First Embodiment described with reference to FIG. 1.

The latch section 31 is similar to the latch section 22 described in the First Embodiment but does not include Mn6. Instead, the latch section 31 includes Mp14 between the power supply VDD and the output terminal OUT. The gate of the Mp14 is connected to the control terminal R via the inverter 26.

Figure 16:
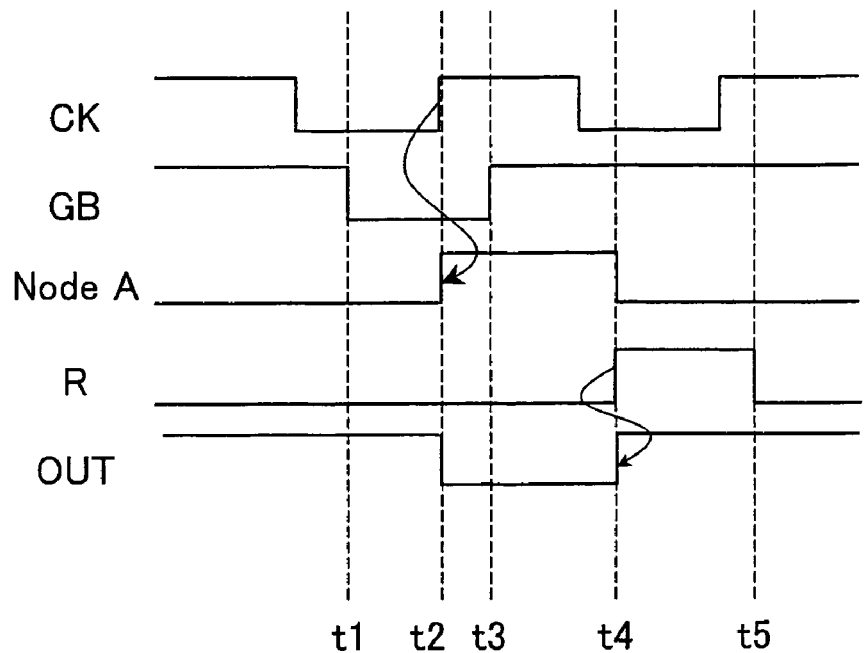
FIG. 16 is a timing chart showing waveforms of input and output signals of the flip-flop shown in FIG. 15.
Figure 17:
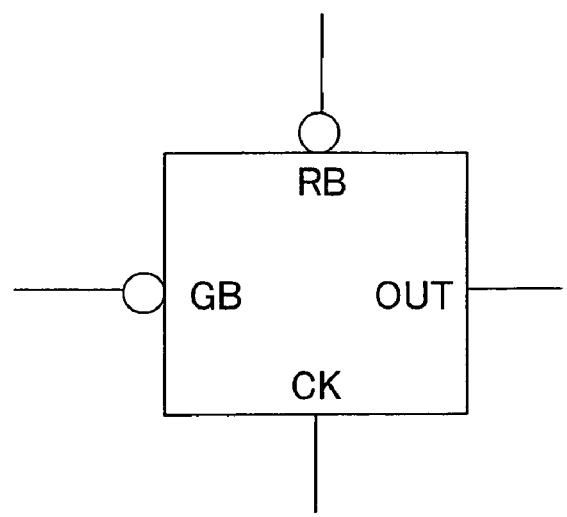
FIG. 17 is a diagram showing a basic structure of a reset-set flip-flop.
Figure 18:
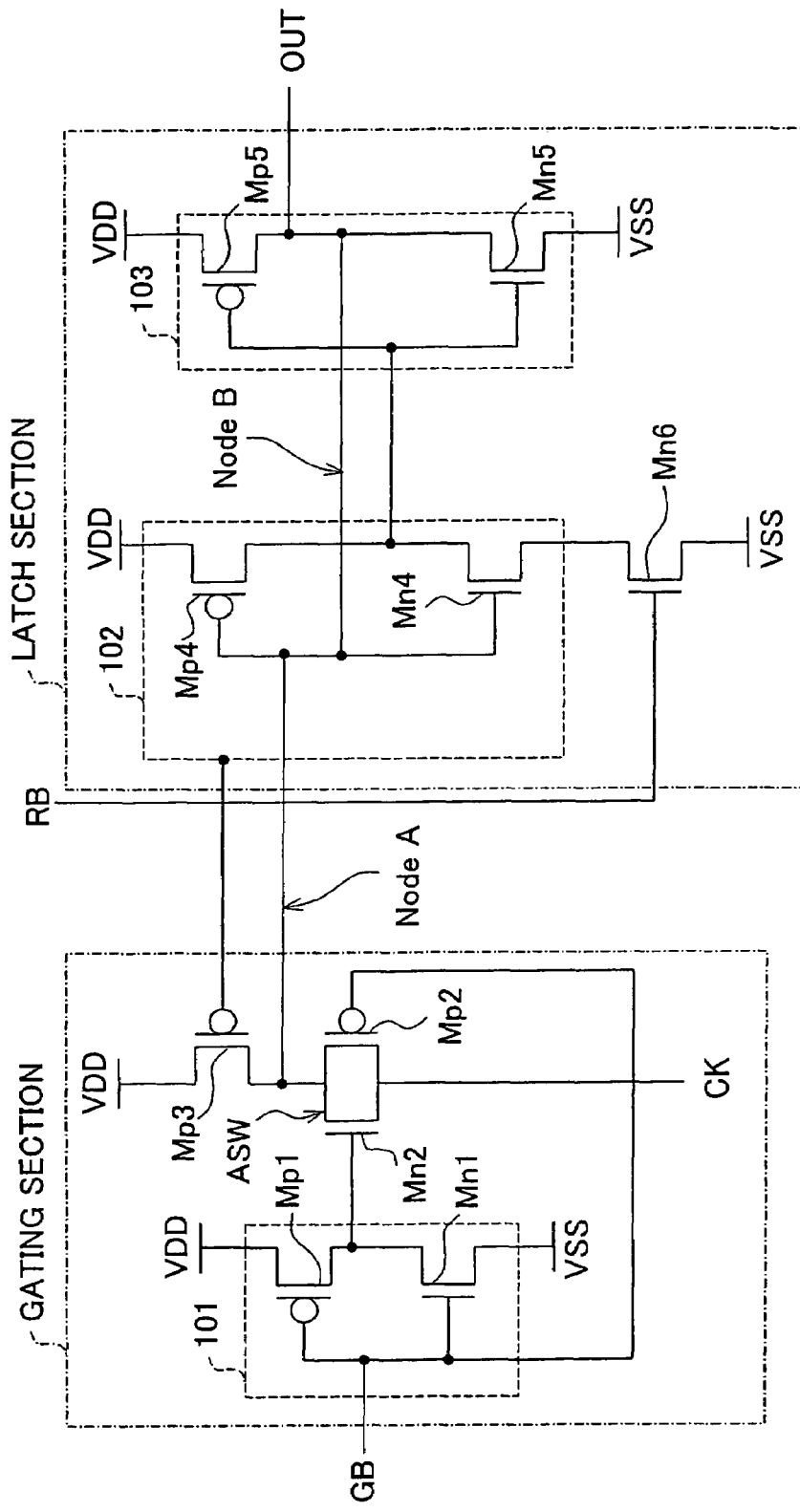
FIG. 18 is a circuit diagram showing an exemplary structure of a conventional RS flip-flop.
Figure 19:
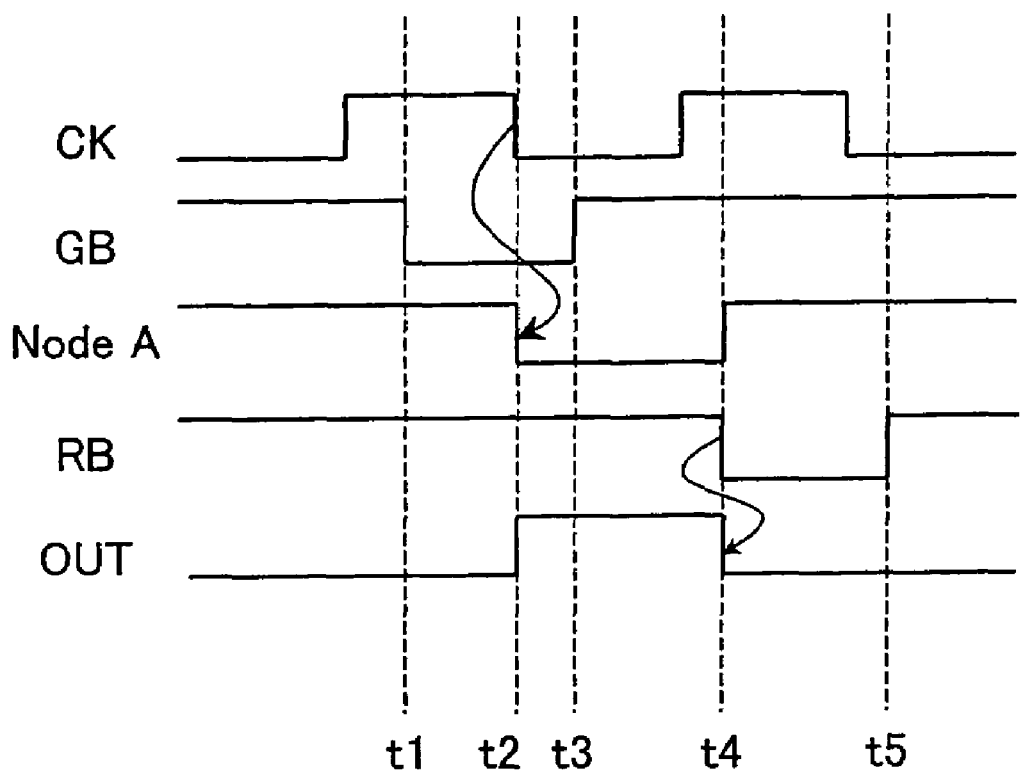
FIG. 19 is a timing chart showing waveforms of input and output signals of the flip-flop shown in FIG. 18.
Figure 20:
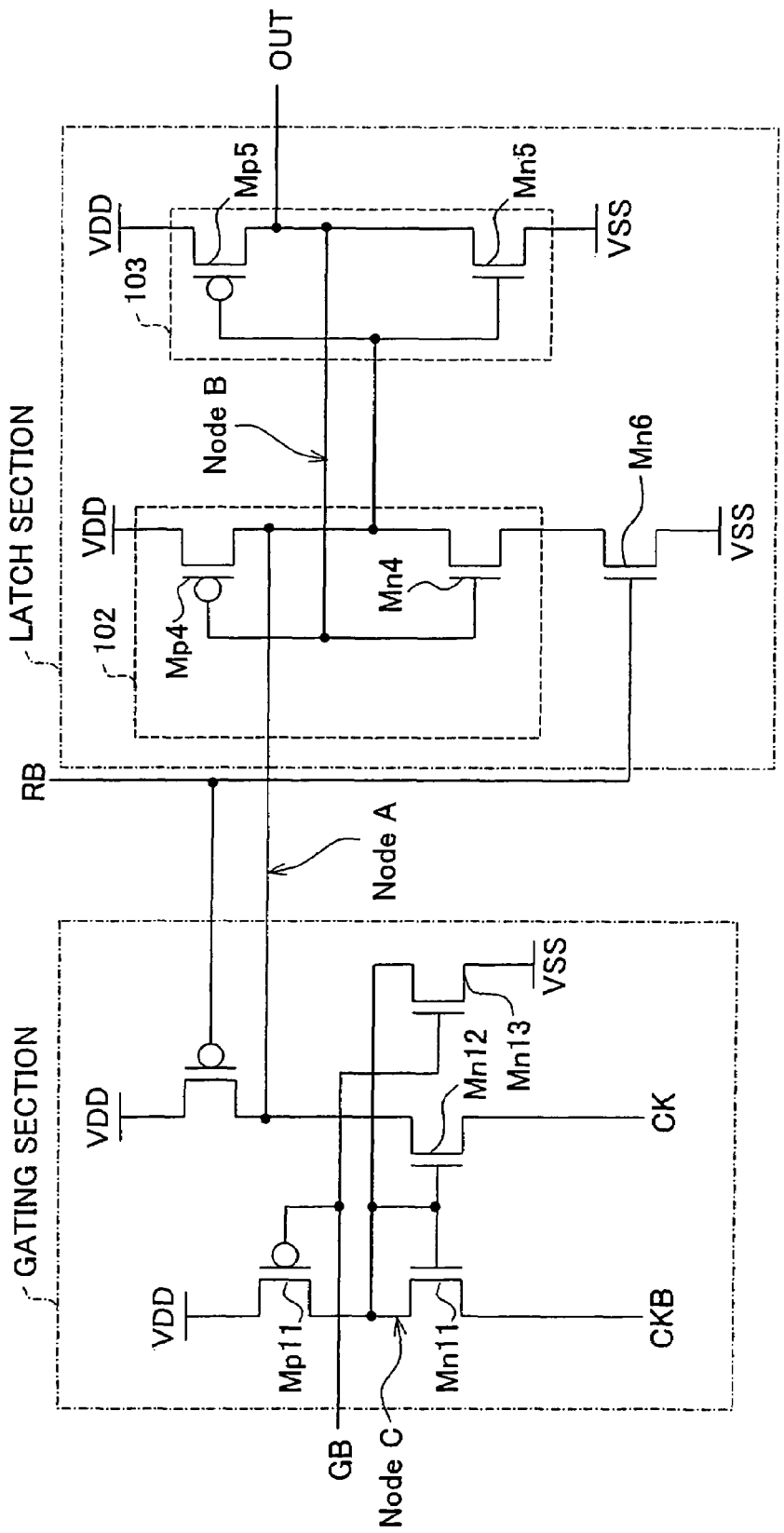
FIG. 20 is a circuit diagram showing another exemplary structure of the conventional RS flip-flop.
Figure 21:
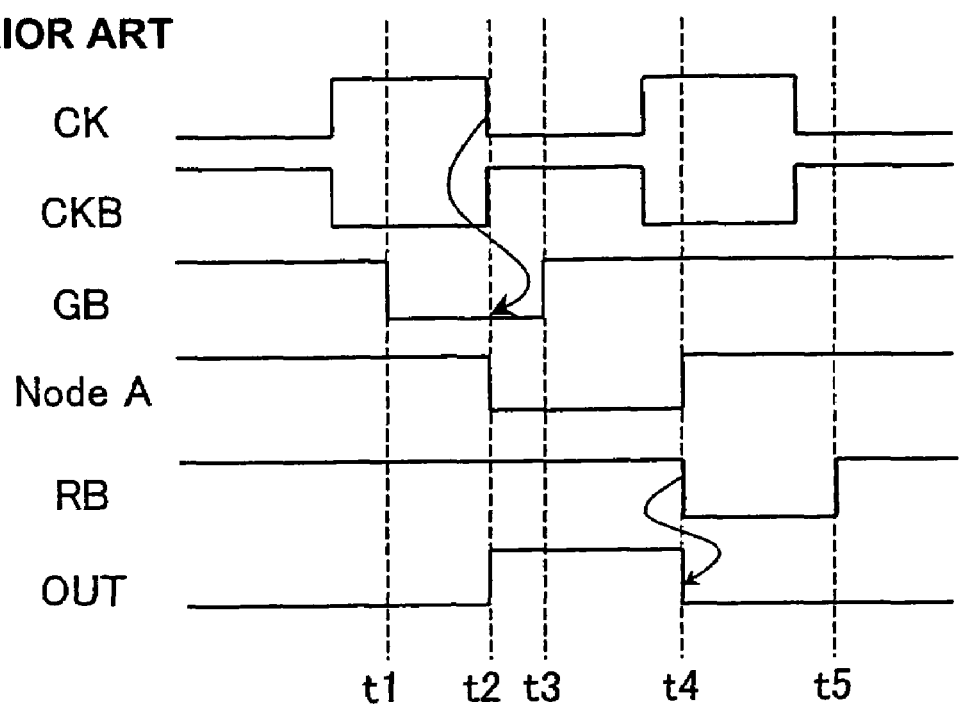
FIG. 21 is a timing chart showing waveforms of input and output signals of the flip-flop shown in FIG. 20.

FIG. 16 depicts waveforms of input and output signals of the RS flip-flop shown in FIG. 15, though no specific explanation will be given for the operations of the circuit. In the RS flip-flop, because the ASW2 is turned on when the output OUT falls, the falling characteristics can be improved by designing the inverter circuit 24 in favor of falling characteristics. On the other hand, because the ASW2 is turned off when the output OUT rises, the rising characteristics of the RS flip-flop can be improved by improving the driving capability of Mp14.

As described above, a flip-flop of an embodiment of the present invention includes: a gating section for sending an externally supplied input signal to a latch section of a following stage according to a control signal separately supplied from the input signal; and a latch section including a latch circuit for latching the input signal supplied from the gating section, wherein the latch section further includes a latch canceling section for canceling a latch state of the latch circuit with an externally supplied reset signal to the latch section, and an output control section for outputting a high potential or Low potential supplied as a power supply for operating the flip-flop.

With this configuration, an output signal of the flip-flop becomes high level (or low level) according to a change in a latched signal (input signal supplied from the gating section) latched in the latch circuit, whereas a low level (or high level) output signal is provided by outputting a high potential or low potential supplied as a power supply for operating the flip-flop.

For example, an output signal of the flip-flop falls at the rise of an input signal latched by the latch circuit. Upon canceling the latch state of the latch circuit with a reset signal, a high potential supplied as an operating power supply of the flip-flop is output as an output signal by the output control section.

In this case, a fall time of the output signal can be reduced by designing the latch circuit in favor of falling characteristics. On the other hand, a rise time of the output signal can be reduced by improving the driving capability of the output control section.

Namely, in a flip-flop configured as above, the falling and rising characteristics of the output signal are separately dependent on the latch circuit and the output control section, allowing for completely independent adjustment. As a result, a flip-flop is obtained that can improve its rising and falling characteristics at the same time.

In a flip-flop according to an embodiment of the present invention, the latch circuit includes two inverter circuits whose respective inputs are connected to their respective outputs between each other, and the latch canceling section is an analog switch whose ON/OFF are switched according to the reset signal, and is disposed between an output terminal of the flip-flop and the output of whichever of the two inverter circuits whose output is connected to the output terminal of the flip-flop, and the output control section is a switching element whose ON/OFF are switched according to the reset signal, and is disposed between the output terminal of the flip-flop and an input terminal of a high potential or low potential supplied as a power supply for operating the flip-flop.

With this configuration, of the two inverter circuits realizing the latch circuit, one whose output is connected to the output terminal of the flip-flop can be used to improve either falling or rising characteristics of the output signal, while the other characteristics are improved by the switching element.

Further, in a flip-flop according to an embodiment of the present invention, the analog switch is a CMOS analog switch including a p-type transistor and an n-type transistor which are connected to each other through their sources and drains, and the p-type transistor and the n-type transistor are directly switched ON or OFF according to the reset signal.

With this configuration, the operations of both the p-type transistor and n-type transistor are directly switched by the reset signal. This ensures the operation of the analog switch.

Further, in a flip-flop according to an embodiment of the present invention, the analog switch is a CMOS analog switch including a p-type transistor and an n-type transistor which are connected to each other through their sources and drains, and the p-type transistor and the n-type transistor are switched ON or OFF such that one of the p-type transistor and the n-type transistor is directly switched according to the reset signal, and that the other of the p-type transistor and the n-type transistor is switched according to fluctuations of a gate-source potential that occur with respect to a supplied constant gate potential.

With this configuration, of the p-type transistor and n-type transistor realizing the analog switch, only the operation of one of the transistors is directly switched by the reset signal. This reduces the number of inverter elements compared with the arrangement in which the both transistors are directly switched by the reset signal.

Further, in a flip-flop according to an embodiment of the present invention, the latch circuit includes two inverter circuits whose respective inputs are connected to their respective outputs between each other, and a clocked inverter is used for one of the two inverter circuits whose output is connected to an output terminal of the flip-flop, so as to cause the latch circuit to also serve as the latch canceling section.

With this configuration, a clocked inverter is used for one of the two inverter circuits realizing the latch circuit, so as to cause the latch circuit to also serve as the latch canceling section. This reduces the circuit area.

A shift register according to an embodiment of the present invention is provided by connecting the flip-flops in multiple stages.

With this configuration, the flip-flops used in the shift register can improve their rising and falling characteristics, and thereby reduces a signal delay in the shift register.

An active-matrix display device according to an embodiment of the present invention includes a scan signal line driving circuit and a data signal line driving circuit, at least one of which uses a shift register of an embodiment of the invention.

With this configuration, using the shift register in the data signal line driving circuit reduces a delay in a sampling signal generated by the shift register. There accordingly will be no shift in the timings of the sampling signal and the data signal fed through data feed lines. With no timing shift, desired data can be stably applied to the source lines. On the other hand, using the shift register in the scan signal line driving circuit makes it easier to time the generated scan signal of the shift register with the data signal supplied to the source lines, thereby realizing stable operation.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A flip-flop comprising:
    a gating section, adapted to receive an input signal and adapted to forward the input signal based upon a control signal; and
    a latch section including,
        a latch circuit including two inverter circuits, the two inverter circuits being connected to receive and latch the input signal provided from the gating section in a latched state, and being disconnected, to cancel the latched state, upon a reset signal being applied to the latch section, and an output control section adapted to output a high potential or low potential, wherein the latch circuit is designed in favor of one of a rising characteristic and a falling characteristic of an output of the flip flop, and the output control section is designed in favor of the other one of the rising characteristic and the falling characteristic of the output of the flip flop.

2. The flip-flop as set forth in claim 1, wherein the two inverter circuits include respective inputs, connected to respective outputs between each other, wherein the latch circuit includes a switch that is switched ON and OFF according to the reset signal, and that is disposed between an output terminal of said flip-flop and the output of one of said two inverter circuits whose output is connected to the output terminal of the flip-flop, and wherein the output control section includes a switching element that is switched ON and OFF according to the reset signal, and that is disposed between the output terminal of said flip-flop and an input terminal of a high potential or low potential supplied as a power supply for operating the flip-flop.

3. The flip-flop as set forth in claim 2, wherein the switch is a transfer gate including a p-type transistor and an n-type transistor connected to each other through respective sources and drains, and wherein the p-type transistor and the n-type transistor are directly switched ON or OFF according to the reset signal.

4. The flip-flop as set forth in claim 2, wherein the switch is a transfer gate including a p-type transistor and an n-type transistor connected to each other through respective sources and drains, and wherein the p-type transistor and the n-type transistor are switched ON or OFF such that one of the p-type transistor and the n-type transistor is directly switched according to the reset signal, and the other of the p-type transistor and the n-type transistor is switched according to fluctuations of a gate-source potential that occur with respect to a supplied constant gate potential.

5. The flip-flop as set forth in claim 1, wherein the two inverter circuits include respective inputs connected to respective outputs, and wherein a clocked inverter is used for one of said two inverter circuits whose output is connected to an output terminal of the flip-flop, to cancel the latched state.

6. The flip-flop as set forth in claim 3, wherein the transfer gate is a CMOS analog switch.

7. The flip-flop as set forth in claim 4, wherein the transfer gate is a CMOS analog switch.

8. A shift register, comprising:
flip-flops connected to one another in multiple stages, the flip-flops each comprising:
   a gating section, adapted to receive an input signal and adapted to forward the input signal based upon a control signal; and
   a latch section including,
      a latch circuit including two inverter circuits, the two inverter circuits being connected to receive and latch the input signal provided from the gating section in a latched state, and being disconnected, to cancel the latched state, upon a reset signal being applied to the latch section, and
      an output control section adapted to output a high potential or low potential, wherein the latch circuit is designed in favor of one of a rising characteristic and a falling characteristic of an output of the flip flop, and the output control section is designed in favor of the other one of the rising characteristic and the falling characteristic of the output of the flip flop.

9. An active-matrix display device comprising a scan signal line driving circuit and a data signal line driving circuit, at least one of which includes a shift register comprising flip-flops connected to one another in multiple stages, the flip-flops each comprising:
   a gating section, adapted to receive an input signal and adapted to forward the input signal based upon a control signal; and
   a latch section including,
      a latch circuit including two inverter circuits, the two inverter circuits being connected to receive and latch the input signal provided from the gating section in a latched state, and being disconnected, to cancel the latched state, upon a reset signal being applied to the latch section, and
      an output control section adapted to output a high potential or low potential, wherein the latch circuit is designed in favor of one of a rising characteristic and a falling characteristic of an output of the flip flop, and the output control section is designed in favor of the other one of the rising characteristic and the falling characteristic of the output of the flip flop.

10. A flip-flop comprising:
gating means for receiving an input signal and for forwarding the input signal based upon a control signal; and
a latch section including,
   latch circuit means, including two inverter circuits, the two inverter circuits of the latch circuit means being connected for receiving and latching the input signal provided from the gating section in a latched state, and being disconnected, for canceling the latched state, upon a reset signal being applied to the latch section, and
   output control means for outputting a high potential or low potential, wherein the latch circuit means is designed in favor of one of a rising characteristic and a falling characteristic of an output of the flip flop, and the output control means is designed in favor of the other one of the rising characteristic and the falling characteristic of the output of the flip flop.

11. The flip-flop as set forth in claim 10, wherein the two inverter circuits include respective inputs, connected to respective outputs between each other, wherein the latch circuit means including a switch that is switched ON and OFF according to the reset signal, and that is disposed between an output terminal of the flip-flop and the output of one of said two inverter circuits whose output is connected to the output terminal of the flip-flop, and wherein the output control means includes a switching element that is switched ON and OFF according to the reset signal, and that is disposed between the output terminal of the flip-flop and an input terminal of a high potential or low potential supplied as a power supply for operating the flip-flop.

12. The flip-flop as set forth in claim 11, wherein the switch is a transfer switch including a p-type transistor and an n-type transistor connected to each other through respective sources and drains, and wherein the p-type transistor and the n-type transistor are directly switched ON or OFF according to the reset signal.

13. The flip-flop as set forth in claim 11, wherein the switch is a transfer switch including a p-type transistor and an n-type transistor connected to each other through respective sources and drains, and wherein the p-type transistor and the n-type transistor are switched ON or OFF such that one of the p-type transistor and the n-type transistor is directly switched according to the reset signal, and the other of the p-type transistor and the n-type transistor is switched according to fluctuations of a gate-source potential that occur with respect to a supplied constant gate potential.

14. The flip-flop as set forth in claim 12, wherein the transfer gate is a CMOS analog switch.

15. The flip-flop as set forth in claim 13, wherein the transfer gate is a CMOS analog switch.

16. The flip-flop as set forth in claim 10, wherein the two inverter circuits include respective inputs being connected to respective outputs, and wherein a clocked inverter is used for one of said two inverter circuits whose output is connected to an output terminal of said flip-flop, so as to cause the latch circuit to also serve as the latch canceling means.

17. A shift register, comprising:
flip-flops connected to one another in multiple stages, the flip-flops each comprising:
gating means for receiving an input signal and for forwarding the input signal based upon a control signal; and
a latch section including,
latch circuit means, including two inverter circuits, the two inverter circuits of the latch circuit means being connected for receiving and latching the input signal provided from the gating section in a latched state, and being disconnected, for canceling the latched state, upon a reset signal being applied to the latch section, and
output control means for outputting a high potential or low potential, wherein the latch circuit means is designed in favor of one of a rising characteristic and a falling characteristic of an output of the flip flop, and the output control means is designed in favor of the other one of the rising characteristic and the falling characteristic of the output of the flip flop.

18. An active-matrix display device comprising a scan signal line driving circuit and a data signal line driving circuit, at least one of which includes a shift register comprising flip-flops connected to one another in multiple stages, the flip-flops each comprising:
gating means for receiving an input signal and for forwarding the input signal based upon a control signal; and
a latch section including,
latch circuit means, including two inverter circuits, the two inverter circuits of the latch circuit means being connected for receiving and latching the input signal provided from the gating section in a latched state, and being disconnected, for canceling the latched state, upon a reset signal being applied to the latch section, and
output control means for outputting a high potential or low potential, wherein the latch circuit means is designed in favor of one of a rising characteristic and a falling characteristic of an output of the flip flop, and the output control means is designed in favor of the other one of the rising characteristic and the falling characteristic of the output of the flip flop.

19. A flip-flop comprising:
a plurality of inverters, connected to latch a received input signal in a latched state;
a switch, disposed between one of the inverters and an output terminal, wherein the switch is adapted to be switched according to an input reset signal to disconnect the plurality of inverters to cancel the latched state; and
a switching element, disposed between the output terminal and an input for receiving a low potential as a power supply of the flip-flop, wherein the switching element is adapted to be switched according to the reset signal, wherein the plurality of inverters are designed in favor of one of a rising characteristic and a falling characteristic of an output of the flip-flop, and at least one of the switch and the switching element is designed in favor of the other one of the rising characteristic and the falling characteristic of the output of the flip-flop.

20. A shift register, comprising a plurality of flip-flops as claimed in claim 19, connected to one another in multiple stages.

21. An active-matrix display device comprising a scan signal line driving circuit and a data signal line driving circuit, at least one of the scan signal line driving circuit and the data signal line driving circuit including the shift register claimed in claim 20.

22. A flip-flop comprising:
means, including a plurality of inverters, connected for latching a received input signal in a latched state,
first switching means, disposed between at least a portion of the means for latching and an output terminal, for switching between two states based upon an input reset signal to disconnect the plurality of inverters to cancel the latched state, and
second switching means, disposed between the output terminal and an input for receiving a low potential as a power supply of the flip-flop, for switching between two states according to the reset signal, wherein means including the plurality of inverters is designed in favor of one of a rising characteristic and a falling characteristic of an output of the flip-flop, and at least one of the first and second switching means is designed in favor of the other one of the rising characteristic and the falling characteristic of the output of the flip-flop.

23. A shift register, comprising a plurality of flip-flops as claimed in claim 22, connected to one another in multiple stages.

24. An active-matrix display device comprising a scan signal line driving circuit and a data signal line driving circuit, at least one of the scan signal line driving circuit and the data signal line driving circuit including the shift register claimed in claim 23.

25. A flip-flop, comprising:
a latch circuit to receive and latch an input signal provided from a gating section when connected in a latched state, the latch circuit including at least two inverter circuits whose respective inputs are connected to respective outputs between each other; and
a latch canceling section to disconnect the at least two inverter circuits to cancel the latched state of the latch circuit upon a reset signal being applied to the latch section, the latch canceling circuit including a switch that is switched ON and OFF according to the reset signal, the switch being disposed between an output terminal of said flip-flop and the output of one of said inverter circuits whose output is connected to the output terminal of the flip-flop, wherein the latch circuit is designed in favor of one of a rising characteristic and a falling characteristic of an output of the flip-flop, and the latch cancelling circuit is designed in favor of the other one of the rising characteristic and the falling characteristic of the output of the flip-flop.

26. The flip-flop of claim 25, wherein the gating section is adapted to receive the input signal and is adapted to forward the input signal to the latch circuit based upon a separately supplied control signal.

27. A shift register, comprising a plurality of flip-flops as claimed in claim 25, connected to one another in multiple stages.

28. A shift register, comprising a plurality of flip-flops as claimed in claim 26, connected to one another in multiple stages.

29. An active-matrix display device comprising a scan signal line driving circuit and a data signal line driving circuit, at least one of the scan signal line driving circuit and the data signal line driving circuit including the shift register claimed in claim 27.

30. An active-matrix display device comprising a scan signal line driving circuit and a data signal line driving circuit, at least one of the scan signal line driving circuit and the data signal line driving circuit including the shift register claimed in claim 28.

31. A flip flop comprising:
a latch circuit, including at least two inverter circuits to receive and latch an input signal when connected in a latched state, and a latch canceling section to disconnect the at least two inverters and cancel the latched state of the latch circuit upon a reset signal being applied; and
an output control section adapted to output a high potential or low potential power supply for operating the flip-flop, wherein the output control section includes a switching element that is switched ON and OFF according to the reset signal and that is disposed between an output terminal of said flip-flop and an input terminal of a high potential or low potential supplied as a power supply for operating the flip-flop, wherein the latch canceling section is designed in favor of one of a rising characteristic and a falling characteristic of an output of the flip flop, and the output control section is designed in favor of the other one of the rising characteristic and the falling characteristic of the output of the flip flop.

32. The flip-flop of claim 31, further comprising:
a gating section, adapted to receive the input signal and adapted to forward the input signal to the latch circuit based upon a control signal.

33. A shift register, comprising a plurality of flip-flops as claimed in claim 31, connected to one another in multiple stages.

34. A shift register, comprising a plurality of flip-flops as claimed in claim 32, connected to one another in multiple stages.

35. An active-matrix display device comprising a scan signal line driving circuit and a data signal line driving circuit, at least one of the scan signal line driving circuit and the data signal line driving circuit including the shift register claimed in claim 33.

36. An active-matrix display device comprising a scan signal line driving circuit and a data signal line driving circuit, at least one of the scan signal line driving circuit and the data signal line driving circuit including the shift register claimed in claim 34.

* * * * *